US012782421B2

(12) United States Patent
Takeuchi et al.

(10) Patent No.: US 12,782,421 B2
(45) Date of Patent: Nov. 3, 2026

(54) SEMICONDUCTOR DEVICE AND ELECTRONIC APPARATUS

(71) Applicant: Sony Semiconductor Solutions Corporation, Kanagawa (JP)

(72) Inventors: Keita Takeuchi, Kanagawa (JP); Satoshi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 171 days.

(21) Appl. No.: 18/845,174

(22) PCT Filed: Apr. 10, 2023

(86) PCT No.: PCT/JP2023/014587
§ 371 (c)(1),
(2) Date: Sep. 9, 2024

(87) PCT Pub. No.: WO2023/210329
PCT Pub. Date: Nov. 2, 2023

(65) Prior Publication Data

US 2025/0180635 A1 Jun. 5, 2025

(30) Foreign Application Priority Data

Apr. 26, 2022 (JP) ................................ 2022-072195

(51) Int. Cl.
*G01R 31/28* (2006.01)
*H10W 90/00* (2026.01)
*H10F 39/95* (2025.01)

(52) U.S. Cl.
CPC ........ *G01R 31/2851* (2013.01); *H10W 90/00* (2026.01); *H10F 39/95* (2025.01); *H10W 90/792* (2026.01)

(58) Field of Classification Search
CPC ........... G01R 31/2851; G01R 31/2853; G01R 31/2856; G01R 31/2884
See application file for complete search history.

(56) References Cited

U.S. PATENT DOCUMENTS 10,262,911 B1 * 4/2019 Gong .................... H10P 74/277
11,682,593 B2 * 6/2023 Liu .................... G01R 1/07378 324/750.3
2007/0069391 A1 * 3/2007 Gritti .................... H10W 90/00 257/777

FOREIGN PATENT DOCUMENTS

JP 2012235114 A 11/2012
JP 2013131688 A 7/2013
(Continued)

OTHER PUBLICATIONS

International Search Report (PCT/ISA/210), International Application No. PCT/JP2023/014587, dated Jun. 20, 2023.

*Primary Examiner* — Tung X Nguyen
(74) *Attorney, Agent, or Firm* — Michael Best & Friedrich LLP

(57) ABSTRACT

Detecting defective joining parts between semiconductor substrates is disclosed. In one example, a semiconductor device includes a first semiconductor substrate and a second semiconductor substrate stacked and joined together, a connection line having a plurality of pairs of connection pads connected to each other with a joint surface between the substrates interposed therebetween, the connection line being routed from one of the first and second semiconductor substrates to the other alternately a plurality of times via the pairs of the connection pads, and a detection circuit configured to detect whether or not the connection line has failed.

18 Claims, 22 Drawing Sheets

(56) References Cited

FOREIGN PATENT DOCUMENTS

| | | | |
|---|---|---|---|
| JP | 2022050238 | A | 3/2022 |
| WO | 2021171785 | A1 | 9/2021 |

* cited by examiner

FIG. 15

| DETEN | TESTIN | SELSW | Z1 | Z2 | OUT (EXPECTED VALUES) | | |
|---|---|---|---|---|---|---|---|
| | | | | | NORMAL CONNECTION LINES | CONNECTION LINE 20-1 DEFECTIVE | CONNECTION LINE 20-2 DEFECTIVE |
| 1 | X | 0 | 0 | 1 | L | H | ~ |
| | | 1 | 1 | 0 | L | ~ | H |
| 0 | 0 | X | X | X | L | | |
| | 1 | | | | H | | |

FIG. 18

| DETEN | TESTIN | SELSW | Z1 | Z2 | OUT (EXPECTED VALUES) | | |
|---|---|---|---|---|---|---|---|
| | | | | | NORMAL CONNECTION LINES | CONNECTION LINE 20-1 DEFECTIVE | CONNECTION LINE 20-2 DEFECTIVE |
| 1 | X | 0 | 1 | 0 | L | H | - |
| | | 1 | 0 | 1 | L | - | H |
| 0 | 0 | X | X | X | L | | |
| | 1 | | | | H | | |

SEMICONDUCTOR DEVICE AND ELECTRONIC APPARATUS

TECHNICAL FIELD

The present technology (technology of the present disclosure) relates to a semiconductor device and an electronic apparatus. More particularly, the present technology relates to a semiconductor device and an electronic apparatus that have a plurality of semiconductor substrates stacked and joined together.

BACKGROUND ART

Methods of detecting a defective joining part between semiconductor substrates are described in PTL 1 and PTL 2 cited below. The method of PTL 1 involves performing tests in which crack test wiring arranged near TSVs (Through-Silicon Vias) is inspected for a break to see if there is any crack nearby. Further, the method of PTL 2 involves carrying out inspections on the assumption that the TSVs have a large capacity.

CITATION LIST

Patent Literature

[PTL 1]
Japanese Patent Laid-open No. 2013-131688
[PTL 2]
Japanese Patent Laid-open No. 2012-235114

SUMMARY

Technical Problem

The methods described in the above-cited PTL 1 and PTL 2 are both incapable of detecting a defective connection pad connecting the substrates together.

An object of the present technology is to provide a semiconductor device and an electronic apparatus configured to be able to detect a defective joining part between semiconductor substrates.

Solution to Problem

A semiconductor device according to one embodiment of the present technology includes a first semiconductor substrate, a second semiconductor substrate stacked on and joined to the first semiconductor substrate, a connection line having a plurality of pairs of connection pads connected to each other with a joint surface between the first semiconductor substrate and the second semiconductor substrate interposed therebetween, the connection line being routed from one of the first semiconductor substrate and the second semiconductor substrate to the other alternately a plurality of times via the pairs of the connection pads, and a detection circuit configured to be able to detect whether or not the connection line has failed. The connection line has a wiring member connecting adjacent ones of the connection pads to each other on each side of the first semiconductor substrate and the second semiconductor substrate. The wiring member has a horizontal wiring part and a vertical wiring part, the horizontal wiring part extending in a horizontal direction, the vertical wiring part extending in a stacking direction and connecting the connection pads to the horizontal wiring part. The connection line has a plurality of connection lines including a first connection line and a second connection line isolated electrically from the first connection line. The first connection line has M (M is an integer of at least 1) of the vertical wiring parts for each connection pad and the second connection line has N (N is an integer of at least 1) of the vertical wiring parts for each connection pad, M being larger than N.

An electronic apparatus according to another embodiment of the present technology includes the above-outlined semiconductor device and an optical system configured to cause the semiconductor device to form an image of image light from a subject.

BRIEF DESCRIPTION OF DRAWINGS

FIG. 15 is a tabular view indicative of a truth table of inputs and outputs to and from a detection circuit in FIG. 14.

FIG. 18 is a tabular view indicative of a truth table of inputs and outputs to and from a detection circuit in FIG. 17.

DESCRIPTION OF EMBODIMENTS

Some preferred embodiments for implementing the present technology are described below with reference to the accompanying drawings. It is to be noted that the embodiments explained hereunder are representatives of the embodiments of the present technology and that the scope of the present technology should not be construed narrowly on the basis of the embodiments to be discussed below.

Throughout the drawings, identical or similar parts are designated by identical or similar reference signs. It is to be noted that the drawings are only schematics and that the relation between thicknesses and planar dimensions and the proportions of different layers in terms of thickness may not coincide with what actually occurs. Specific thicknesses and dimensions should thus be determined from a reading of the ensuing description. In addition, obviously, different drawings may include differences in size or proportion of the same parts.

Further, the embodiments to be described below are examples of methods and devices embodying the technical idea of the present technology. As such, these embodiments are not limitative of the technical idea of the present technology in terms of the material, shape, structure, or arrangement of constituent elements. The technical idea of the present technology can be diversely modified within the technical scope thereof as defined by the appended claims.

The description will be made in the following order:

1. First Embodiment
2. Second Embodiment
3. Application examples
   Example of application to electronic apparatus
   Example of application to mobile object

First Embodiment

This first embodiment is described below as an example of applying the present technology to a light detecting device serving as a back-illuminated CMOS (Complementary Metal Oxide Semiconductor) image sensor. It is to be noted that the light detecting device is an exemplary semiconductor device.

<<Exemplary Configuration of Test System>>

Figure 1:
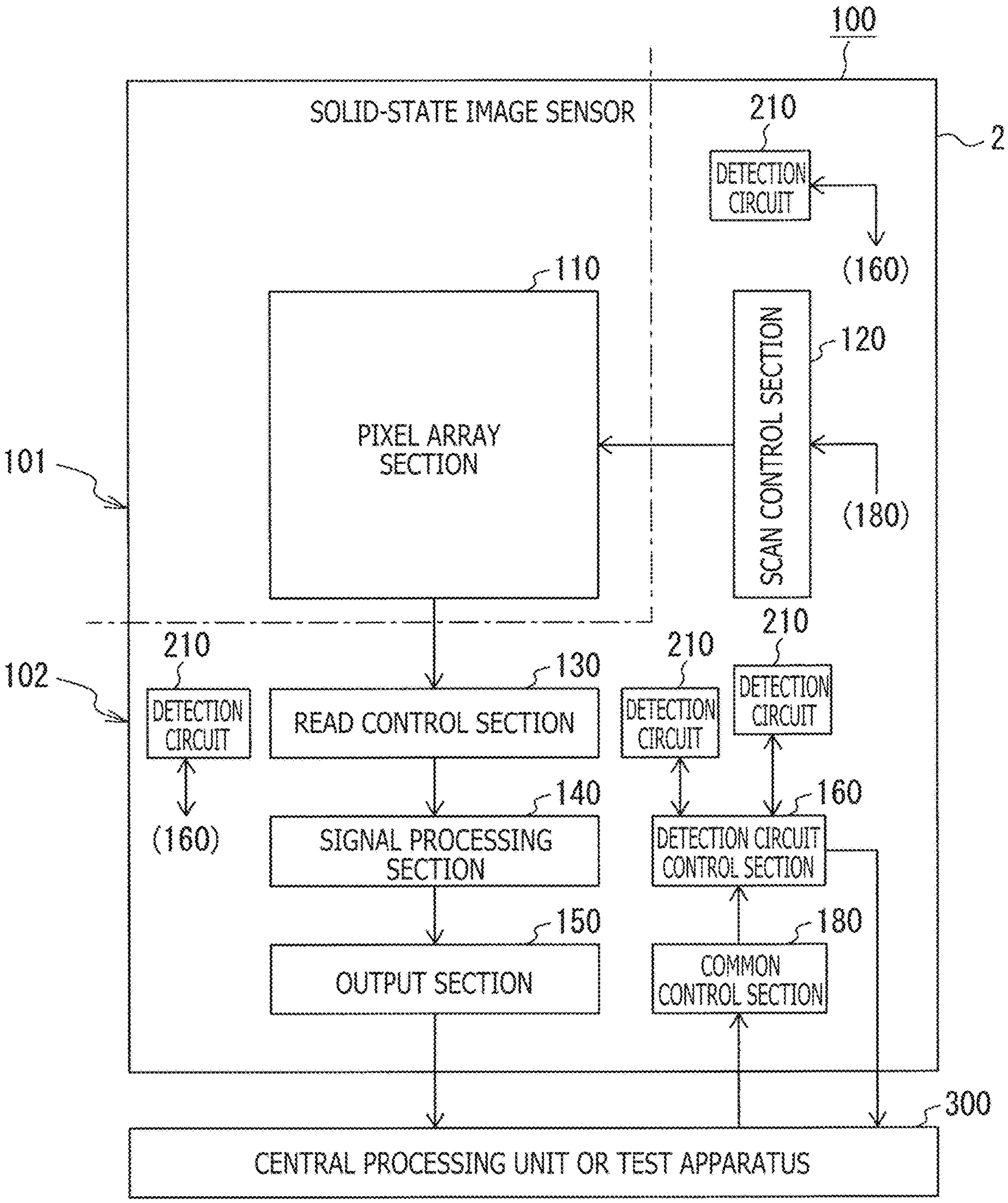
FIG. 1 is a block diagram depicting an exemplary configuration of a test system in a first embodiment of the present technology.

FIG. 1 is a block diagram depicting an exemplary configuration of a test system in the embodiment of the present technology. The test system is designed to detect whether or not a semiconductor device such as a light detecting device has failed. The test system includes a light detecting device 100 and either a central processing unit or a test device 300. Further, the light detecting device 100 includes a pixel array section 110, a scan control section 120, a read control section 130, a signal processing section 140, an output section 150, and a common control section 180.

<<Exemplary Configuration of Light Detecting Device>>

The light detecting device 100 is mounted on a semiconductor chip 2. The semiconductor chip 2 has a first semiconductor substrate 101 and a second semiconductor substrate 102 stacked and joined together. Further, the light detecting device 100 includes a plurality of detection circuits 210 and a detection circuit control section 160 electrically connected to the plurality of detection circuits 210. The plurality of detection circuits 210 are located at different positions in the light detecting device 100 when viewed from above. Further, the detection circuits 210 are each furnished with a plurality of connection lines, to be discussed later. It is to be noted that the detection circuits 210 are only required to be provided on either one of the first semiconductor substrate 101 and the second semiconductor substrate 102 stacked and joined together; there is no need to provide the detection circuits 210 on both substrates. The present embodiment is explained on the assumption that the detection circuits 210 are provided on the second semiconductor substrate 102 and not on the first semiconductor substrate 101.

Further, the circuits inside the light detecting device 100 are arranged dispersed on the first semiconductor substrate 101 and the second semiconductor substrate 102 stacked together. For example, the pixel array section 110 is arranged on the first semiconductor substrate 101, and the remaining circuits are arranged on the second semiconductor substrate 102. It is to be noted that the circuits arranged both on the first semiconductor substrate 101 and on the second semiconductor substrate 102 are not limited to the configuration depicted in the figure. For example, the pixel array section 110, the read control section 130, and a comparator in the signal processing section 140 can be arranged on the first semiconductor substrate 101, with the remaining circuits arranged on the second semiconductor substrate 102. Further, whereas two semiconductor substrates (101 and 102) are stacked together, three or more semiconductor substrates can alternatively be stacked, and the circuits in the light detecting device 100 can be arranged on these substrates.

The pixel array section 110 has at least those of pixels 3 which perform photoelectric conversion arranged in a two-dimensional grid pattern. The pixel array section 110 serves as a light-receiving surface that receives light collected by an optical system 402 depicted in FIG. 19, for example. Under control of the common control section 180, the scan control section 120 causes the pixel array section 110 to output pixel signals, by sequentially driving the rows thereof. The read control section 130 reads the pixel signal from each row of the pixel array section and feeds the read pixel signals to the signal processing section 140. The read control section 130 includes a read circuit 15.

Figure 2:
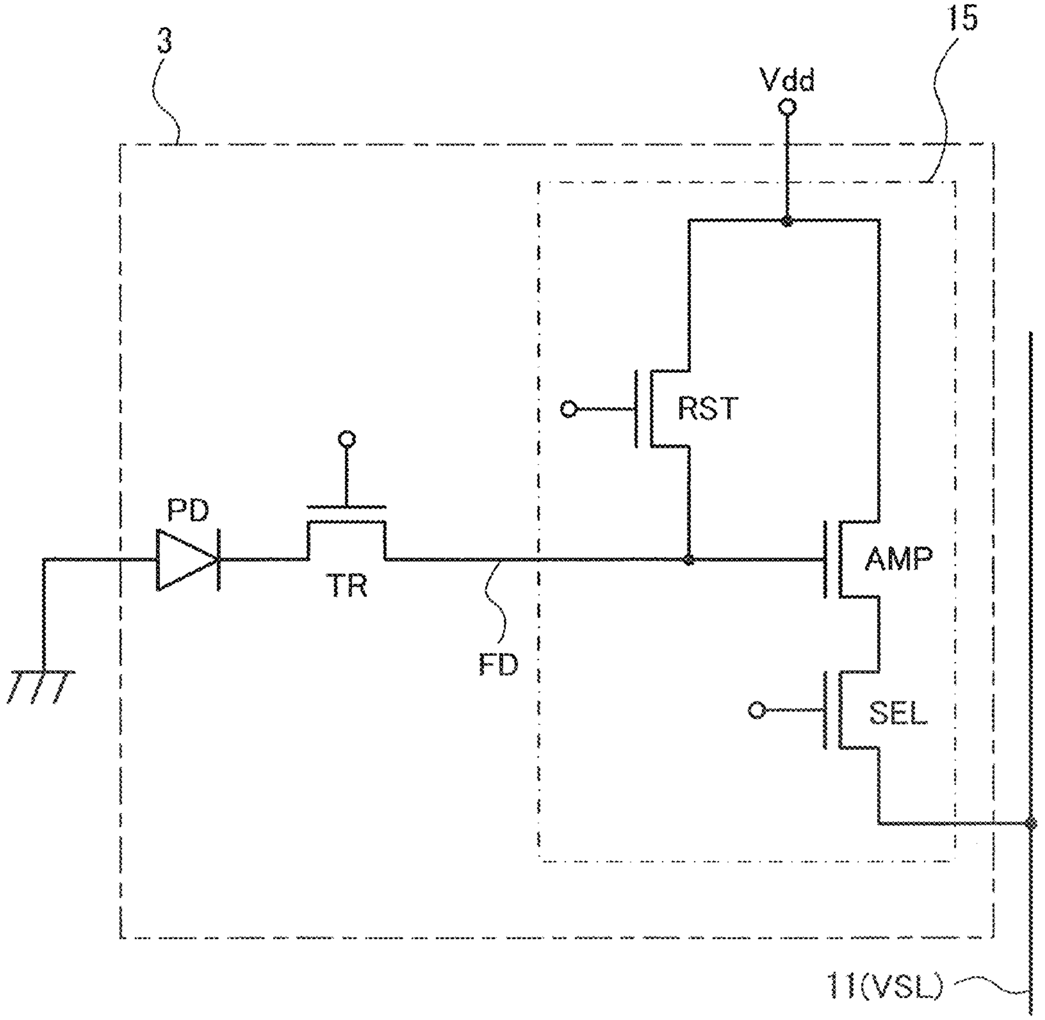
FIG. 2 is an equivalent circuit diagram of a pixel of a light detecting device in the first embodiment of the present technology.

FIG. 2 is an equivalent circuit diagram depicting an exemplary configuration of a pixel 3. The pixel 3 includes a photoelectric conversion element PD, a charge storage region (Floating Diffusion) FD that stores (holds) a signal charge photoelectrically converted by the photoelectric conversion element PD, and a transfer transistor TR that transfers to the charge storage region FD the signal charge photoelectrically converted by the photoelectric conversion element PD. The pixel 3 also includes the read circuit 15 possessed by the read control section 130. The read circuit 15 is electrically connected to the charge storage region FD.

The photoelectric conversion element PD generates the signal charge reflecting the amount of received light. The photoelectric conversion element PD further stores (holds) temporarily the signal charge thus generated. A cathode side of the photoelectric conversion element PD is electrically connected to a source region of the transfer transistor TR. An anode side of the photoelectric conversion element PD is electrically connected to a reference potential line (e.g., ground). For example, a photodiode is used as the photoelectric conversion element PD.

A drain region of the transfer transistor TR is electrically connected to the charge storage region FD. A gate electrode of the transfer transistor TR is electrically connected to a transfer transistor drive line from among pixel drive lines.

The charge storage region FD temporarily stores and holds the signal charge transferred from the photoelectric conversion element PD via the transfer transistor TR.

The read circuit 15 reads the signal charge stored in the charge storage region FD, and outputs a pixel signal based on the signal charge. For example, the read circuit 15 includes, but is not limited to, an amplification transistor AMP, a selection transistor SEL, and a reset transistor RST used as pixel transistors. These transistors (AMP, SEL, and RST) are each constituted, for example, by a MOSFET that has a gate insulating film including a silicon oxide film ($SiO_2$ film), a gate electrode, and a pair of main electrode regions functioning as a source region and a drain region. Alternatively, these transistors may each be constituted by a MISFET (Metal Insulator Semiconductor FET) with its gate insulating film including a silicon nitride film ($Si_3N_4$ film) or a multilayer film including a silicon nitride film and a silicon oxide film, for example.

The source region of the amplification transistor AMP is electrically connected to the drain region of the selection transistor SEL, and the drain region of the amplification transistor AMP is electrically connected to a power supply line Vdd and to the drain region of the reset transistor. Further, the gate electrode of the amplification transistor AMP is electrically connected to the charge storage region FD and to the source region of the reset transistor RST.

The source region of the selection transistor SEL is electrically connected to a vertical signal line 11 (VSL), and the drain of the selection transistor SEL is electrically connected to the source region of the amplification transistor AMP. Further, the gate electrode of the selection transistor SEL is electrically connected to a selection transistor drive line from among the pixel drive lines.

The source region of the reset transistor RST is electrically connected to the charge storage region FD and to the gate electrode of the amplification transistor AMP, and the drain region of the reset transistor RST is electrically connected to the power supply line Vdd and to the drain region of the amplification transistor AMP. The gate electrode of the reset transistor RST is electrically connected to a reset transistor drive line from among the pixel drive lines.

The signal processing section 140 in FIG. 1 is designed to perform signal processing such as an AD (Analog to Digital) conversion process and a CDS (Correlated Double Sampling) process on the pixel signal. The signal processing section 140 supplies the processed pixel signal to the output section 150.

The output section 150 outputs pixel data with the pixel signals arranged therein to the central processing unit or test device 300.

Before explaining the detection circuits 210, the detection circuit control section 160, and the common control section 180, the configuration of the first semiconductor substrate 101 and the second semiconductor substrate 102 stacked together is described below with reference to FIGS. 3A through 3C.

Figure 3A:
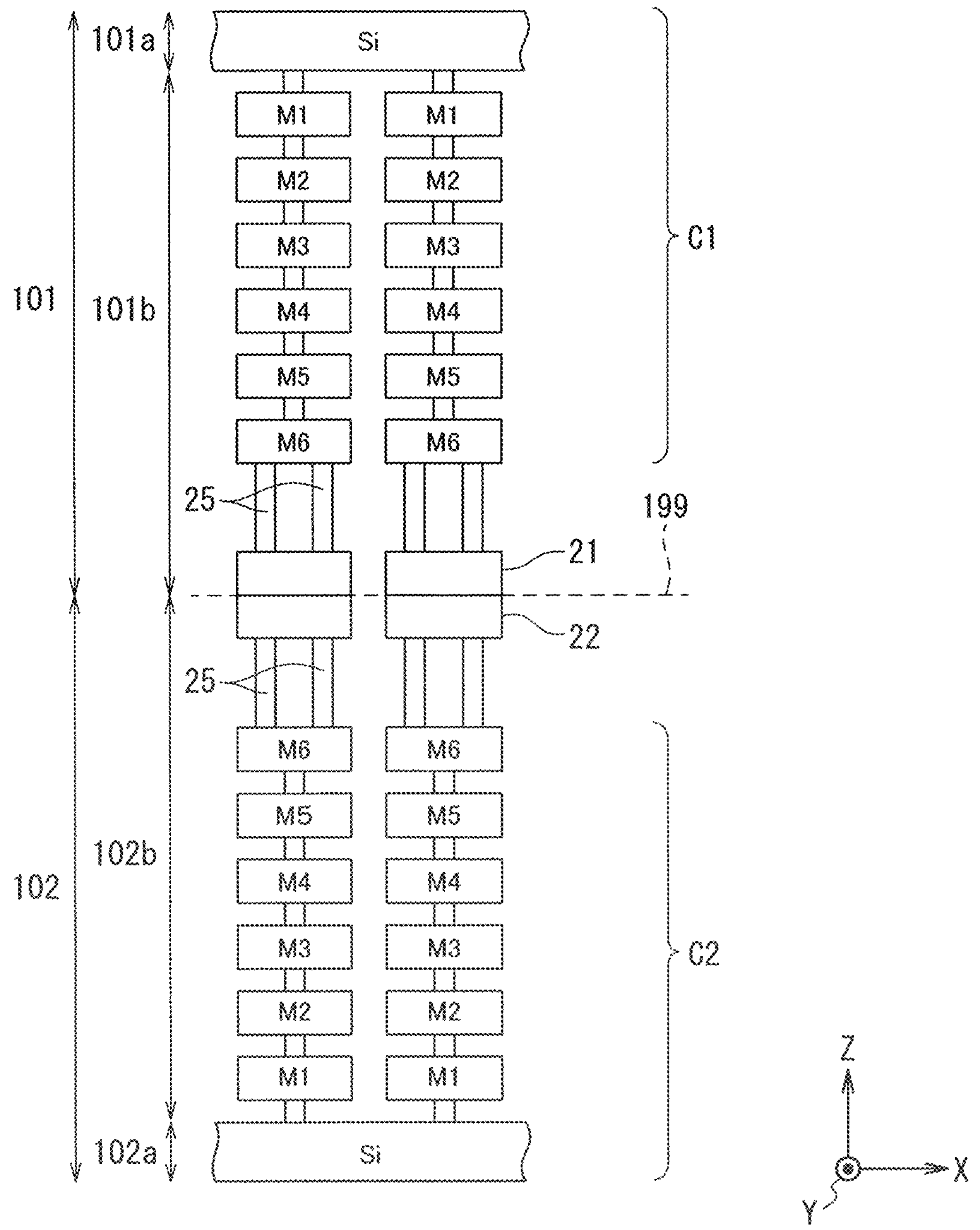
FIG. 3A is a partial longitudinal cross-sectional view of a first circuit and a second circuit configured on a first semiconductor substrate and a second semiconductor substrate, respectively, of the light detecting device in the first embodiment of the present technology.

FIG. 3A is a partial longitudinal cross-sectional view of a first circuit C1 and a second circuit C2 configured on the first semiconductor substrate 101 and on the second semiconductor substrate 102, respectively. Given here is an example in which the first semiconductor substrate 101 and the second semiconductor substrate 102 are stacked together with a joint surface 199 interposed therebetween. A six-layer metal wiring layer is assumed to be provided, for example, on the first semiconductor substrate 101 and on the second semiconductor substrate 102. The constituent layers are designated by reference signs M1 through M6 starting from a silicon (Si) layer.

The first semiconductor substrate 101 has a semiconductor layer 101*a*, and a wiring layer 101*b* stacked on the semiconductor layer 101*a*. The semiconductor layer 101*a* is configured with the pixel array section 110 and the photoelectric conversion element PD, among others. The wiring layer 101*b* is a multilayer wiring layer including an insulating film, a metal wiring layer, connection pads 21 facing the joint surface 199, and vertical wiring parts 25 as vias that extend in the stacking direction and that electrically connect the connection pads 21 to the metal wiring layer M6 of the first circuit C1. The second semiconductor substrate 102 includes a semiconductor layer 102*a*, and a wiring layer 102*b* stacked on the semiconductor layer 102*a*. The semiconductor layer 102*a* is configured with elements such as transistors. The wiring layer 102*b* is a multilayer wiring layer including an insulating film, a metal wiring layer, connection pads 22 facing the joint surface 199, and vertical wiring parts 25 as vias that extend in the stacking direction and that electrically connect the connection pads 22 to the metal wiring layer M6 of the second circuit C2.

The connection pads 21 and 22 are hybrid-connected. That is, a surface of the connection pad 21 facing the joint surface 199 and a surface of the connection pad 22 facing the joint surface 199 are stacked and joined together. Further, joining the connection pads 21 and 22 together electrically connects the first circuit C1 mounted on the first semiconductor substrate 101 to the second circuit C2 mounted on the second semiconductor substrate 102. It is to be noted that, in order to distinguish the connection pads 21 and 22 in FIG. 3A from the connection pads 21 and 22 in FIGS. 3B and 3C, to be discussed later, the connection pads 21 and 22 in FIG. 3A may be referred to as circuit connection pads 21 and 22 and the connection pads 21 and 22 in FIGS. 3B and 3C as test connection pads 21 and 22. It is to be noted that, in the case where these two types of connection pads are not distinguished from each other, they will be simply referred to as the connection pads 21 and 22. Further, in order to distinguish the vertical wiring parts 25 in FIG. 3A from the vertical wiring parts 25 in FIGS. 3B and 3C, to be discussed later, the vertical wiring parts 25 in FIG. 3A may be referred to as the circuit vertical wiring parts 25 and the vertical wiring parts 25 in FIGS. 3B and 3C as the test vertical wiring parts 25. It is to be noted that, in the case where these two types of vertical wiring parts are not distinguished from each other, they will be simply referred to as the vertical wiring parts 25. Further, the circuit vertical wiring parts 25 are provided for each circuit connection pad.

Figure 3B:
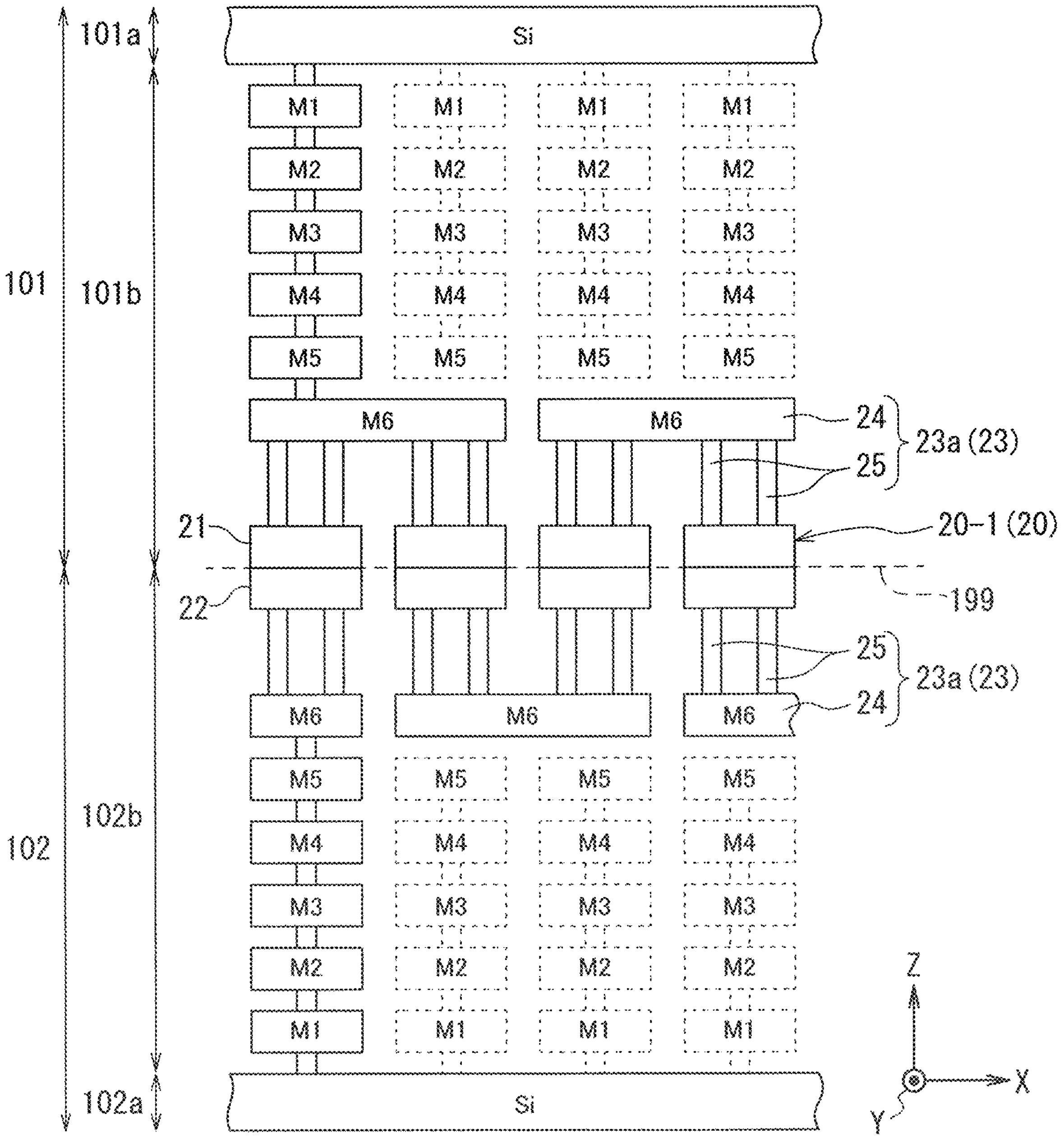
FIG. 3B is a partial longitudinal cross-sectional view of a connection line configured in the light detecting device of the first embodiment of the present technology.
Figure 3C:
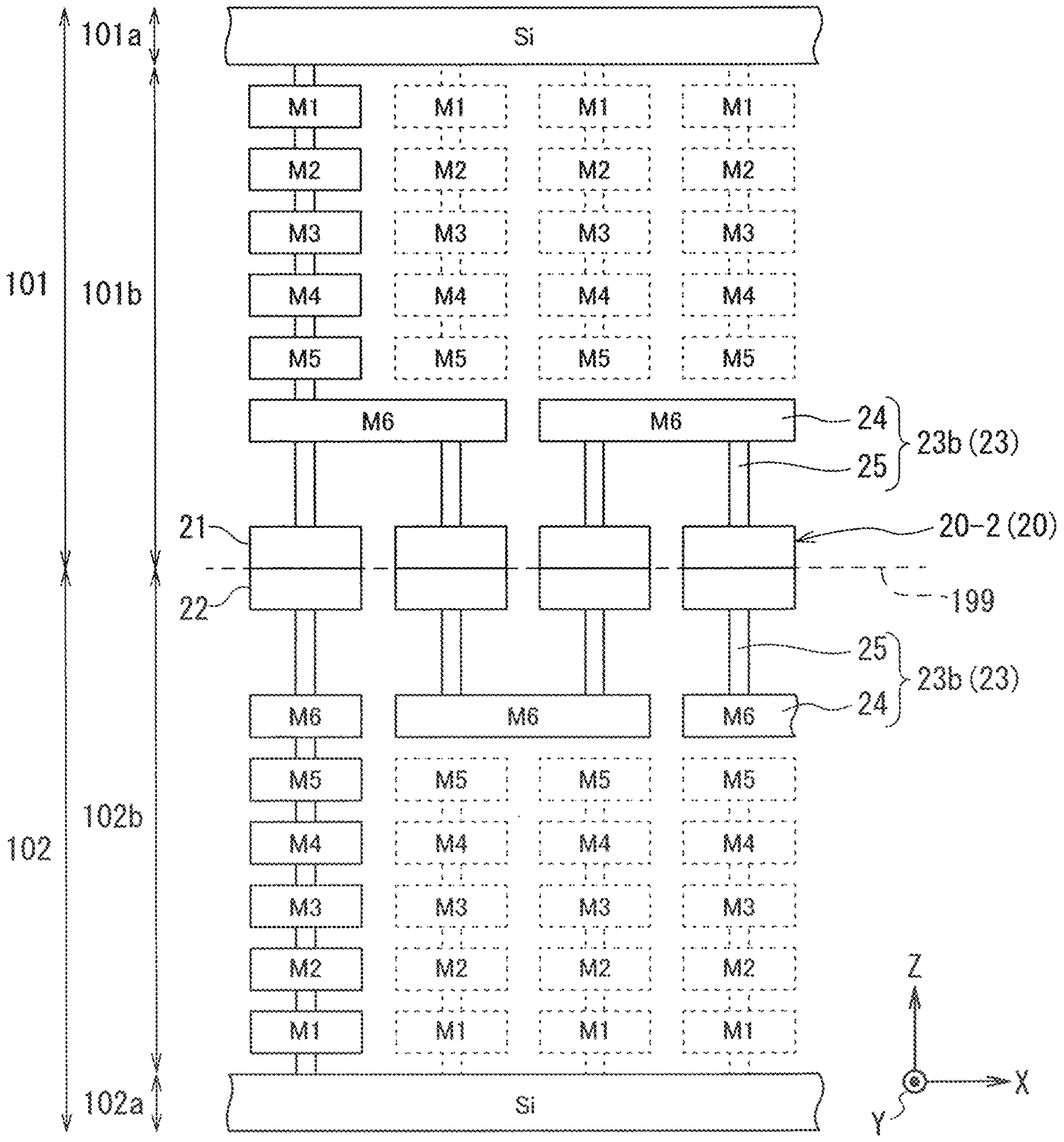
FIG. 3C is another partial longitudinal cross-sectional view of the connection line configured in the light detecting device of the first embodiment of the present technology.

FIGS. 3B and 3C each partially depict a connection line 20. The connection line 20 forms a test pattern for detecting a joining failure between the first semiconductor substrate 101 and the second semiconductor substrate 102. The connection line 20 is provided for each detection circuit 210. The connection line 20 has a plurality of pairs of connection pads 21 and 22 connected to each other with the joint surface 199 between the first semiconductor substrate 101 and the second semiconductor substrate 102 interposed therebetween. The connection line 20 is routed from one of the first semiconductor substrate 101 and the second semiconductor substrate 102 to the other substrate alternately a plurality of times by way of the pairs of connection pads 21 and 22. It is to be noted that the paired connection pads 21 and 22 possessed by the connection line 20 are provided independently of the connection pads (circuit connection pads) 21 and 22 electrically connecting the first circuit C1 to the second circuit C2 as depicted in FIG. 3A. As such, the paired connection pads 21 and 22 of the connection line 20 are not used to connect the first circuit C1 to the second circuit C2. The connection pads 21 and 22 include metal. The connection pads 21 and 22 include, but not limited to, copper (Cu), for example. It is to be noted that the number of the pairs of connection pads 21 and 22 possessed by the connection line is not limited to the numbers indicated in FIGS. 3B, 3C, and in subsequent drawings.

On each side of the first semiconductor substrate 101 and the second semiconductor substrate 102, the connection line 20 has a wiring member 23 that connects adjacent connection pads to each other. The wiring member 23 has a horizontal wiring part 24 extending in the horizontal direction, and a vertical wiring part 25 that extends in the stacking direction and connects the connection pad 21 or 22 to the horizontal wiring part 24. It is to be noted that the horizontal wiring part 24 is wiring that belongs, but is not limited, to the metal wiring layer M6, for example. Further, the vertical wiring part 25 constitutes, but is not limited to, a via, for example. The horizontal wiring part 24 and the vertical wiring part 25 are only required to be constituted by use of known metal.

Configured as described above, the connection line 20 is routed from the first semiconductor substrate 101 to the second semiconductor substrate 102 by way of the wiring member 23, the connection pad 21, and the connection pad 22, in that order. Thereafter, the connection line 20 is routed from the second semiconductor substrate 102 to the first semiconductor substrate 101 via the wiring member 23, the connection pad 22, and the connection pad 21, in that order. In this manner, the connection line 20 is routed from one of the first semiconductor substrate 101 and the second semiconductor substrate 102 to the other substrate alternately a plurality of times. Routing a plurality of pairs of connection pads 21 and 22 in one continuous piece as described above is known as formation of a daisy chain.

Explained below are possible joining failures between the first semiconductor substrate 101 and the second semiconductor substrate 102 in FIG. 3A. The joining failures that may occur between the first semiconductor substrate 101 and the second semiconductor substrate 102 constitute, but are not limited to, failures associated with the paired connection pads 21 and 22, for example. The failures associated with the paired connection pads 21 and 22 include, for example, a poor joint between connection pads, peeling after the joining, and a faulty joint caused by dislocation of the substrates at the time of their joining. The failures associated with the paired connection pads 21 and 22 further include a poor joint or peeling between the connection pads 21 and 22 on one hand and the vertical wiring parts 25 as vias on the other hand, a poor joint or peeling between the vertical wiring parts 25 and the wiring belonging to the metal wiring layer M6, and the like. In the present embodiment, the failures such as those enumerated above are checked by use of the connection line 20, which forms the test pattern. If any failure like the above-described failures occurs on the connection line 20, the resistance value of the connection line 20 surges. Further, if a break is caused in the connection line 20, the electrical conductivity of the connection line 20 is disconnected. Also, the detection circuits 210 are used to inspect whether or not the connection line 20 has failed.

The light detecting device 100 has a plurality of connection lines 20 electrically isolated from each other. In the present embodiment, the light detecting device 100 has two connection lines, i.e., the connection line 20 depicted in FIG. 3B and the connection line 20 indicated in FIG. 3C. Further, connection lines 20-2 and 20-1 are electrically isolated from each other. It is to be noted that, in order to distinguish the connection line 20 in FIG. 3B from the connection line 20 in FIG. 3C, the connection line 20 in FIG. 3B will be referred to as the connection line 20-1 and the connection line 20 in FIG. 3C as the connection line 20-2. In the case where the connection lines 20-1 and 20-2 are not distinguished from each other, they will simply be referred to as the connection lines 20.

The plurality of connection lines 20 are each inspected for failure by the detection circuit 210. More specifically, the detection circuit 210 selects one of the plurality of connection lines 20 and inspects the selected connection line 20 for failure. In the present embodiment, the connection lines 20-1 and 20-2 are each inspected for failure by the detection circuit 210.

Figure 4A:
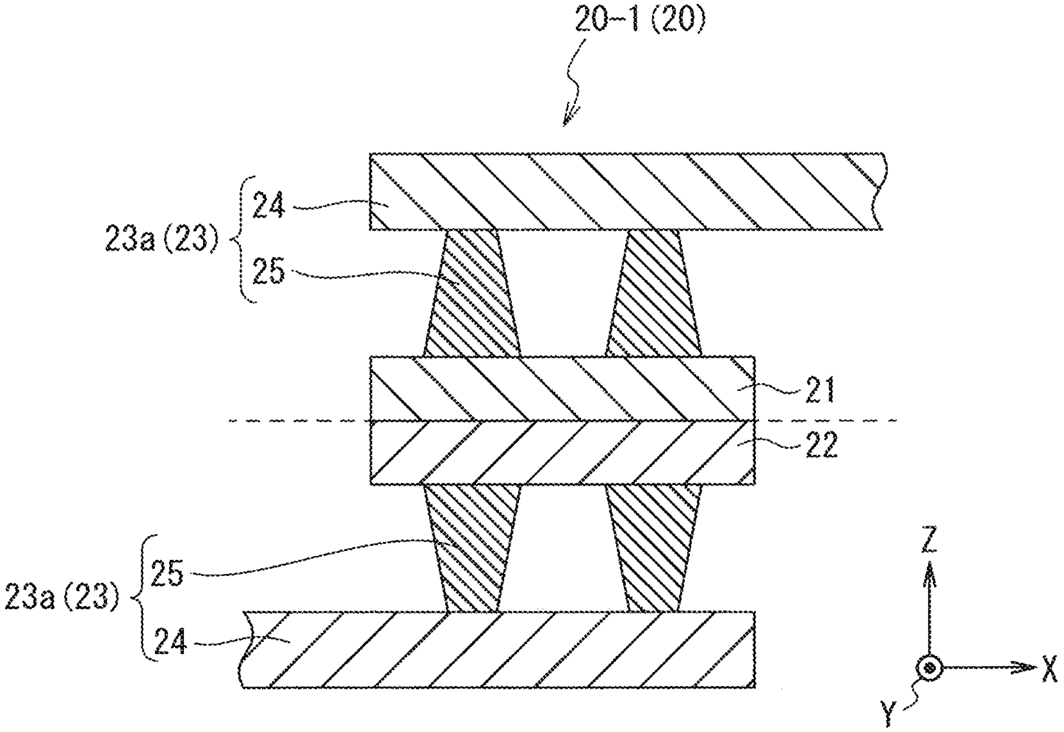
FIG. 4A is another partial longitudinal cross-sectional view of the connection line configured in the light detecting device of the first embodiment of the present technology.
Figure 4B:
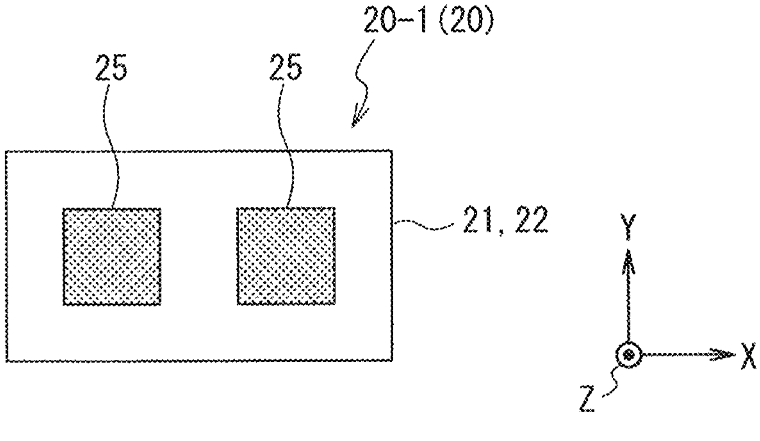
FIG. 4B is a plan view depicting a positional relation between a connection pad and vertical wiring parts on the connection line in FIG. 4A.
Figure 5A:
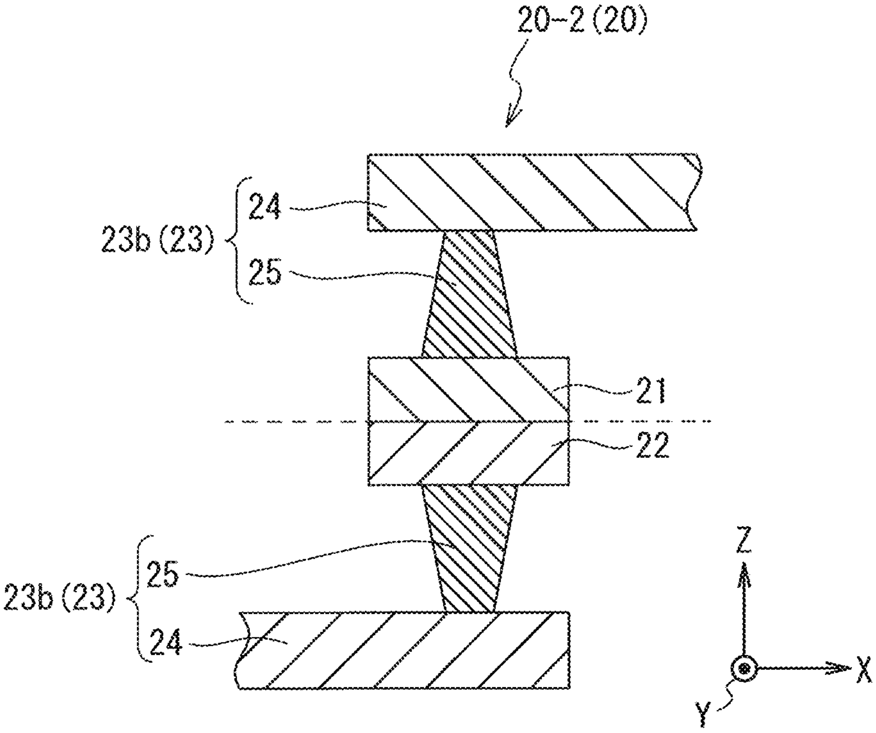
FIG. 5A is another partial longitudinal cross-sectional view of the connection line configured in the light detecting device of the first embodiment of the present technology.
Figure 5B:
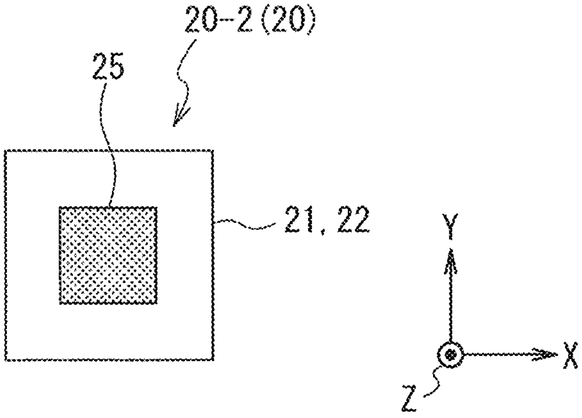
FIG. 5B is a plan view depicting a positional relation between a connection pad and a vertical wiring part on the connection line in FIG. 5A.

Further, the plurality of connection lines 20 each have a different number of vertical wiring parts 25 provided for each connection pad. In other words, one connection line 20 may be said to be formed by the vertical wiring parts 25 connecting the same number of pairs of connection pads in daisy chain. As the connection lines 20, the light detecting device 100 has a plurality of connection lines including a first connection line and a second connection line electrically isolated from the first connection line. The first connection line has M (M is an integer of at least 1) vertical wiring parts 25 per connection pad, and the second connection line has N (N is an integer of at least 1) vertical wiring parts 25 per connection pad, M being larger than N. In the present embodiment, as depicted in FIGS. 3B, 4A, and 4B, the connection line 20-1 has two (corresponding to the first connection line where M=2) vertical wiring parts 25 per connection pad. More specifically, the connection line 20-1 is formed by connecting a plurality of pairs of connection pads in daisy chain, each of the connection pads being provided with two vertical wiring parts 25. Further, a wiring member 23*a*, which is the wiring member possessed by the connection line 20-1, has one horizontal wiring part 24, and two vertical wiring parts 25 provided for each connection pad. Also, as depicted in FIGS. 3C, 5A, and 5B, the connection line 20-2 has one (corresponding to the second connection line where N=1) vertical wiring part 25 per connection pad. More specifically, the connection line 20-2 is formed by connecting a plurality of pairs of connection pads in daisy chain, each of the connection pads being provided with one vertical wiring part 25. Further, a wiring member 23*b*, which is the wiring member possessed by the connection line 20-2, has one horizontal wiring part 24, and one vertical wiring part 25 provided for each connection pad. It is to be noted that, in the case where the wiring members 23*a* and 23*b* are not distinguished from each other, they will simply be referred to as the wiring members 23.

Further, the connection line 20-1 has as many vertical wiring parts 25 per connection pad as the number (2 in the present embodiment) of circuit vertical wiring parts 25 provided for each of the circuit connection pads 21 and 22 in FIG. 3A. When the vertical wiring parts 25 of the connection line 20-1 are thus configured in number, it is possible to test for failure the same configuration as that in which the first circuit C1 and the second circuit C2 are electrically connected to each other.

Further, the number of the vertical wiring parts 25 possessed by the connection line 20-2 per connection pad is smaller than the number of the vertical wiring parts 25 possessed by the connection line 20-1 per connection pad. In the present embodiment, the connection line 20-2 has one vertical wiring part 25 per connection pad.

The connection line 20-1 has two vertical wiring parts 25 per connection pad. For this reason, even in the case of peeling taking place between the connection pad 21 and one vertical wiring part 25, the likelihood of occurrence of a break in the connection line 20-1 is low. That is, the robustness of the connection line 20-1 is high. By contrast, the connection line 20-2 has only one vertical wiring part 25 per connection pad. It follows that, in the case of peeling between the connection pad 21 and the one vertical wiring part 25, the likelihood of the connection line 20-2 developing high resistance or breaking is higher than the likelihood of the connection line 20-1 developing high resistance or breaking. That is, the robustness of the connection line 20-2 is lower than the robustness of the connection line 20-1, the connection line 20-2 being more likely to fail than the connection line 20-1. Since the connection line 20-2 is more prone to fail than the connection line 20-1, the connection line 20-2 may be said to constitute a more sensitive failure detection test pattern than the connection line 20-1.

Figure 6:
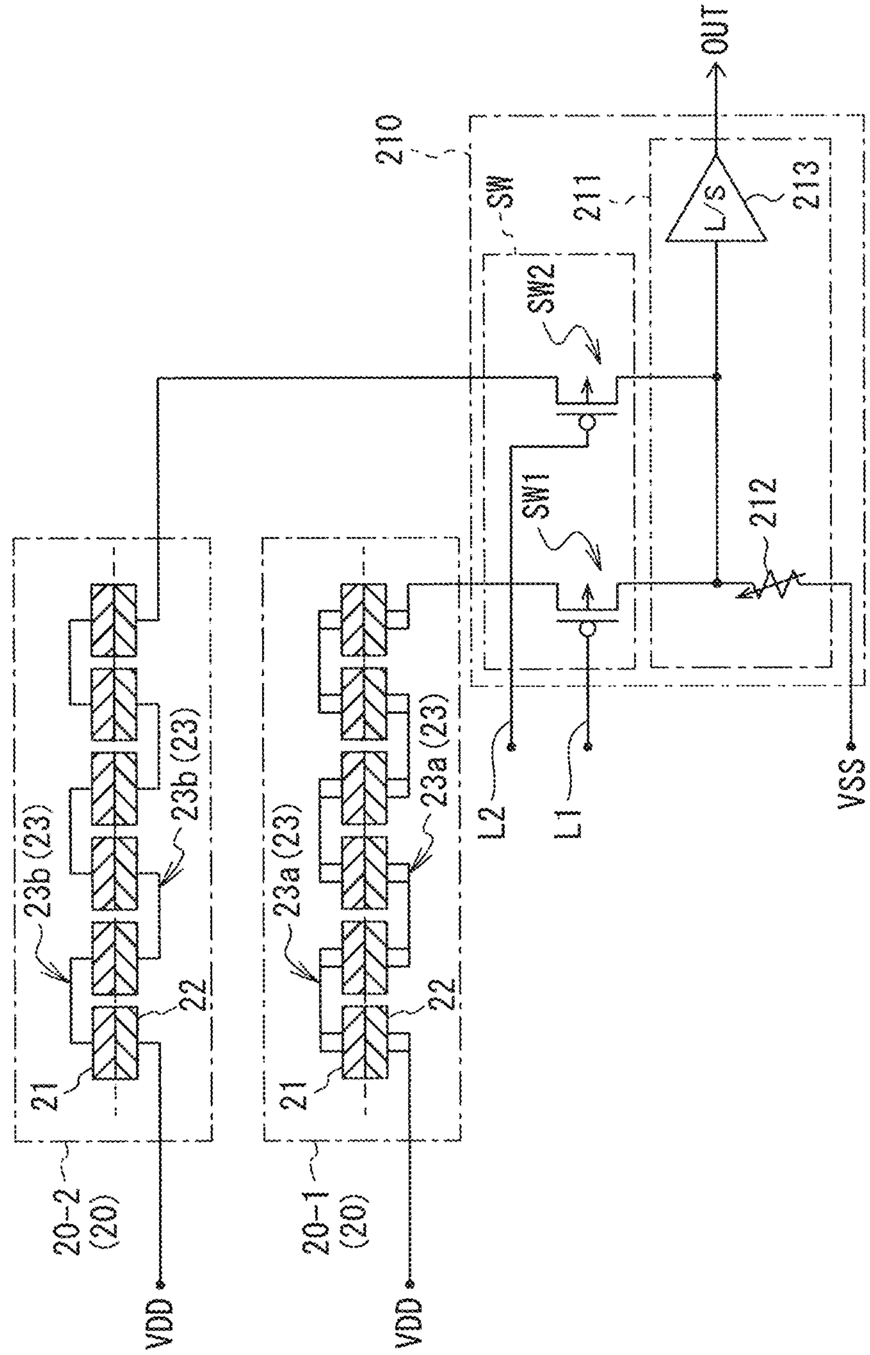
FIG. 6 is an explanatory diagram depicting a connection relation between a detection circuit and connection lines of the light detecting device in the first embodiment of the present technology.

As depicted in FIG. 6, a plurality of connection lines 20 are provided for each detection circuit 210. Under control of the detection circuit control section 160, the detection circuit 210 detects whether or not any connection line 20 has failed. The detection circuit 210 then supplies the detection circuit control section 160 with an output signal OUT indicating the result of the detection. It is to be noted that the connection lines 20 are depicted schematically in FIG. 6. The schematic depiction will also apply in the subsequent drawings.

The detection circuit 210 has a failure detecting circuit 211 and a selection circuit SW that selectively connects one of the plurality of connection lines 20 to the failure detecting circuit 211, the detection circuit 210 being configured to detect whether or not any connection line 20 connected to the failure detecting circuit 211 has failed. In the present embodiment, two connection lines 20, i.e., connection lines 20-1 and 20-2, are configured to be selectively connected to the failure detecting circuit 211 by the selection circuit SW. This allows the detection circuit 210 to directly detect whether or not the connection line 20 connected to the failure detecting circuit 211 has failed.

The failure detecting circuit 211 has a resistance element 212 and a determination circuit 213. One end of the resistance element 212 has a first potential as a reference potential VSS (e.g., ground). Further, one end of the connection line 20 has a second potential as a power supply potential VDD different from the first potential. In the present embodiment, the second potential is higher than the first potential. Another end of the connection line 20 can be electrically connected to another end of the resistance element 212 via the selection circuit SW. The selection circuit SW has switches provided for each connection line 20. More specifically, the selection circuit SW has a switch SW1 and a switch SW2, the switch SW1 being interposed between the connection line 20-1 and the resistance element 212 of the failure detecting circuit 211, the switch SW2 being interposed between the connection line 20-2 and the resistance element 212 of the failure detecting circuit 211. The switches SW1 and SW2 are constituted by, but not limited to, pMOS transistors, for example. In the case where "0" as a gate control signal SELSW is input to a gate electrode of the pMOS transistor, the pMOS transistor is turned on to connect the connection line 20 electrically to the resistance element 212 of the failure detecting circuit 211. In the case where "1" as the gate control signal SELSW is input to the gate electrode of the pMOS transistor, the pMOS transistor is turned off to disconnect the connection line 20 electrically from the resistance element 212 of the failure detecting circuit 211. The plurality of switches possessed by the selection circuit SW are each turned on and off under control of the detection circuit control section 160. More specifically, when only one of the plurality of switches is turned on under control of the detection circuit control section 160, the selection circuit SW selectively connects one of the plurality of connection lines 20 to the failure detecting circuit 211. A drive line L1 is electrically connected to the gate electrode of the switch SW1, and a drive line L2 is electrically connected to the gate electrode of the switch SW2. Under control of the detection circuit control section 160, the gate control signal SELSW is input to the gate electrodes of the switches via the drive lines L1 and L2. Further, while inspection is not being performed, all switches possessed by the selection circuit SW can be turned off to suppress flowing of currents to the connection lines 20, which can help reduce power consumption.

The determination circuit 213 is a buffer connected interposingly between the connection line 20 connected to the failure detecting circuit 211 and the resistance element 212. The determination circuit 213 detects a third potential, i.e., the potential at a position between the connection line 20 connected to the failure detecting circuit 211 and the resistance element 212. On the basis of the third potential, the determination circuit 213 detects whether or not the connection line 20 connected to the failure detecting circuit 211 has failed. The determination circuit 213 outputs the result of the detection as an output signal OUT. More specifically, the determination circuit 213 is, for example, a level shifter circuit that compares the third potential with a failure threshold value. In the case where the third potential is higher than the failure threshold value, the determination circuit 213 outputs "H" as the output signal OUT indicating that the connection line 20 connected to the failure detecting circuit 211 has no failure. In the case where the third potential is equal to or lower than the failure threshold value, the determination circuit 213 outputs "L" as the output signal OUT indicating that the connection line 20 connected to the failure detecting circuit 211 has failed. If the connection line 20 connected to the failure detecting circuit 211 has developed a failure such as peeling, currents do not flow easily on the connection line 20, so that the resistance value of the connection line 20 rises. The third potential then becomes lower than in the case where there is no failure. In the case where there is a break in the connection line 20 connected to the failure detecting circuit 211, the third potential also becomes lower than in the case where there is no failure. As a result, comparing the third potential with the failure threshold value makes it possible to detect whether or not the connection line 20 connected to the failure detecting circuit 211 has failed. It is to be noted that the failure threshold value can be varied by changing the resistance value of the resistance element 212. The resistance element 212 is, but not limited to, a variable resistor as depicted in the drawing, for example.

Figure 7:
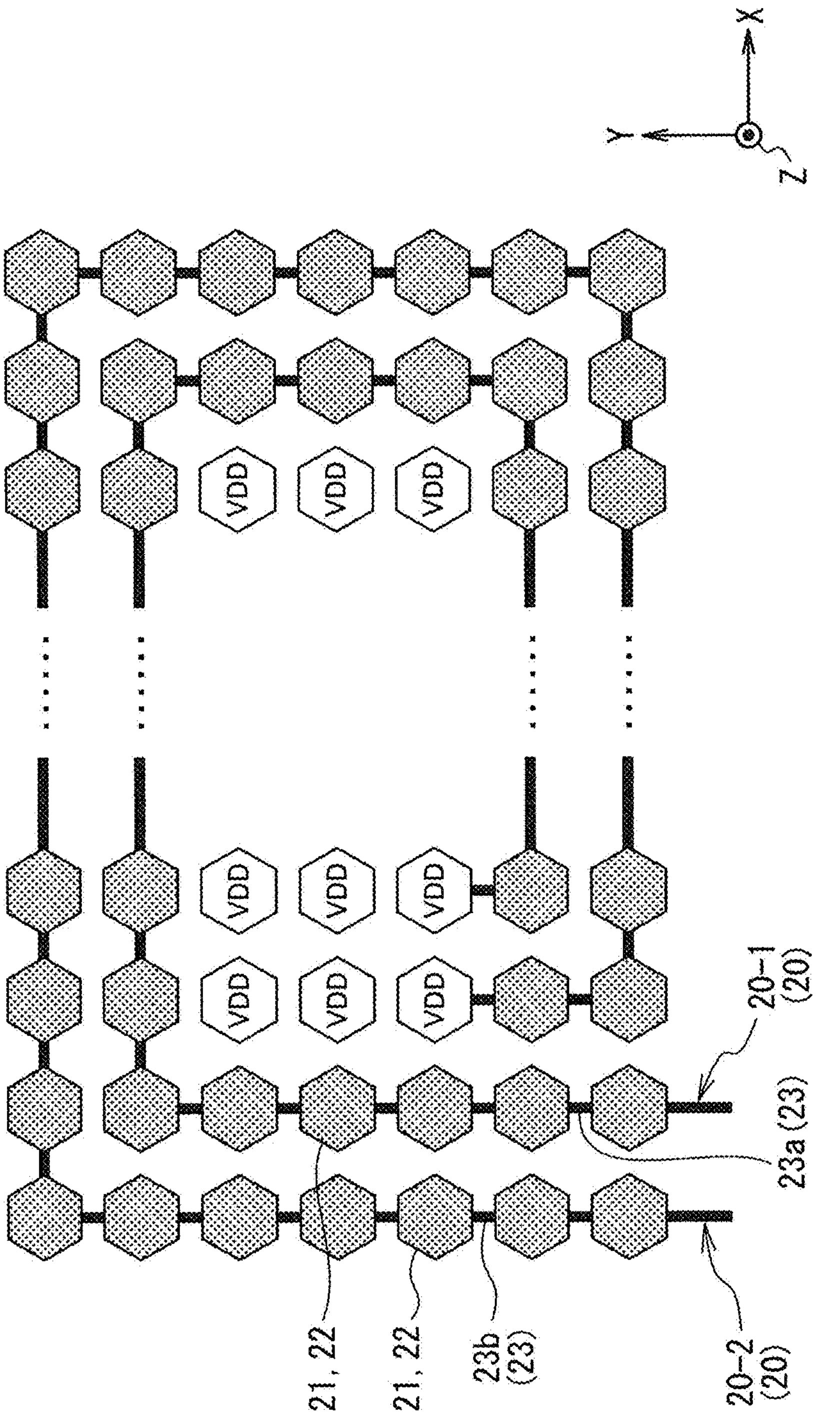
FIG. 7 is a plan view schematically depicting a planar arrangement of the connection lines in the first embodiment of the present technology.

FIG. 7 is a plan view schematically depicting a planar arrangement of the connection lines 20-1 and 20-2. As depicted in FIG. 7, for example, the connection lines 20-1 and 20-2 are routed a plurality of times in different directions. Further, the terminals that supply the power supply voltage VDD include terminals for supplying the voltage to the first circuit C1 and the second circuit C2 and terminals for supplying the voltage to the connection lines 20. The connection lines 20-1 and 20-2 routed in this manner are provided for each of the plurality of detection circuits 210 depicted in FIG. 1 and are arranged near the detection circuits 210.

The common control section 180 in FIG. 1 controls each of the circuits in the light detecting device 100. Further, the common control section 180 receives various instruction signals from the central processing unit or test device 300 and, based on the received instruction signals, controls the circuits in the light detecting device 100. For example, in synchronism with a vertical synchronization signal from the central processing unit or test device 300, the common control section 180 control operation timings of the scan control section 120 and of the signal processing section 140. In another example, the common control section 180 supplies the detection circuit control section 160 with a connection line selection signal received from the central processing unit or test device 300. The connection line selection signal is a signal that indicates which of the plurality of connection lines 20 is to be inspected.

The detection circuit control section 160 is a circuit that controls the operations of the detection circuits 210 based on various instruction signals received from the common control section 180. For example, the detection circuit control section 160 controls the selection circuit SW on the basis of the connection line selection signal received from the common control section 180. Also, the detection circuit control section 160 receives the output signal OUT from the detection circuit 210, and supplies the received output signal OUT or a signal representative of the output signal OUT to the central processing unit or test device 300.

<<Exemplary Configuration of Central Processing Unit or Test Device>>

As depicted in FIG. 1, the central processing unit or test device 300 is, for example, an external device that inspects the light detecting device 100 for various failures. By use of image data received from the light detecting device 100, for example, the central processing unit or test device 300 detects whether or not any circuit other than the detection circuits 210, such as a pixel in the pixel array section 110, has failed. Also, the central processing unit or test device 300 inspects the connection lines 20, for example. In this case, the central processing unit or test device 300 supplies the connection line selection signal to the common control section 180, and receives the output signal OUT or a signal representative of the output signal OUT from the detection circuit control section 160.

Further, whereas the detection circuits such as the detection circuits 210 and the detection circuit control section 160 are provided in the light detecting device 100, these circuits can alternatively be arranged in a semiconductor device other than the light detecting device 100.

<<Major Advantages of First Embodiment>>

Before describing major effects of the first embodiment, the related technology is explained hereunder. The techniques described in the above-cited PTL 1 and PTL 2 do not directly detect failures related to the pairs of connection pads joined together when the semiconductor substrates are bonded. PTL 1 describes performing tests in which the crack test wiring arranged near the TSVs is inspected for a break to see if there is any crack nearby. Further, PTL 2 describes carrying out inspections on the assumption that the TSVs have a large capacity. Consequently, the technique of PTL 2 cannot be applied to the connection pads.

By contrast, the light detecting device 100 in the first embodiment of the present technology has the connection lines 20 including the paired connection pads 21 and 22, and the detection circuits 210 that are directly connected to the connection lines 20 and that are capable of directly detecting whether or not any connection line 20 has failed. It is thus possible directly to detect a failure of the connection line 20 including the paired connection pads 21 and 22 joined together with the joint surface 199 interposed therebetween. This can improve the accuracy of detecting a defective joining part between the first semiconductor substrate 101 and the second semiconductor substrate 102.

Further, the technique described in the above-cited PTL 2 involves determining whether or not there is a failure, based on a response to charging and discharging. This makes it difficult to optimize the failure detecting circuit. Also, it takes time to carry out tests on the basis of a time constant. By contrast, the light detecting device 100 in the first embodiment of the present technology is simply configured to compare the third potential with the failure threshold value, digitally outputting a binary value of “H” or “L” indicative of the result of comparing the third potential with the failure threshold value. As a result, faire tests are easy to perform. Further, with no need to use the time constant, the time required to perform tests can be prevented from being prolonged.

Further, the technique described in the above-cited PTL 1 involves providing the failure detecting circuits for each of the joined plurality of chips. By contrast, the light detecting device 100 in the first embodiment of the present technology need only have the failure detecting circuits provided on one of the first semiconductor substrate 101 and the second semiconductor substrate 102 stacked and joined together. This can help prevent the chip size from enlarging.

Further, the light detecting device 100 in the first embodiment of the present technology has a plurality of connection lines 20 including the connection line 20-1 and the connection line 20-2 electrically isolated from the connection line 20-1, and the detection circuits capable of detecting whether or not any connection line 20 has failed. The connection line 20-1 has M (M is an integer of at least 1) vertical wiring parts 25 per connection pad, and the connection line 20-2 has N (N is an integer of at least 1) vertical wiring parts 25 per connection pad, M being larger than N. In this manner, two types of connection lines are provided, i.e., the connection line 20-1 more robust but having a lower failure detection sensitivity as the test pattern than the connection line 20-2, and the connection line 20-1 less robust but having a higher failure detection sensitivity as the test pattern than the connection line 20-1. This makes it possible to evaluate the state of the failure of any connection line 20 from a plurality of angles. For example, in the case where no failure has been detected from both of the connection lines 20-1 and 20-2 having been tested, there is considered to be a low possibility of the connection line 20-1 having a difficult-to-detect failure such as partial peeling. Thus, the state of the failure of any connection line 20 is better understood not only from the resistance value of the connection line 20 being high or low but also from how the members of the connection line 20 are joined together. In this manner, providing the plurality of connection lines 20 makes it possible to obtain, for example, various findings such as what kind of failure has occurred on the connection line 20, from what part of the connection line 20 the failure has started, and how the failure has progressed over time. Further, the connection line 20-2 has one (corresponding to the second connection line where N=1) vertical wiring part 25 per connection pad. The number of vertical wiring parts 25 provided for each connection pad is the smallest in the case where N=1. As a result, of the plurality of connection lines 20, the connection line 20 with N=1 has the highest failure detection sensitivity. Further, in the case where the connection line 20 with N=1 has not developed a failure, there is considered to be a low possibility of a difficult-to-detect failure such as partial peeling having occurred on any connection line more robust than that connection line 20.

Further, the light detecting device 100 in the first embodiment of the present technology has the detection circuit 210 that includes the failure detecting circuit 211 and the selection circuit SW for selectively connecting one of the plurality of connection lines 20 to the failure detecting circuit 211, the detection circuit 210 being configured to detect whether or not the connection line 20 connected to the failure detecting circuit 211 has failed. Using the selection circuit SW in this manner allows the plurality of connection lines 20 to share one detection circuit 210. This can help prevent the chip size from enlarging.

Further, the light detecting device 100 in the first embodiment of the present technology includes as many vertical wiring parts 25 possessed by the connection line 20-1 per connection pad as the number of circuit vertical wiring parts 25 provided for each circuit connection pad. When the vertical wiring parts 25 of the connection line 20-1 are thus configured in number, it is possible to test for failure the same configuration as that in which the first circuit C1 and the second circuit C2 are electrically connected to each other. This makes it possible to obtain knowledge regarding the electrical connection between the first circuit C1 and the second circuit C2.

Further, while inspection is not being performed by the light detecting device 100 in the first embodiment of the present technology, all switches possessed by the selection circuit SW can be turned off to suppress flowing of currents to the connection lines 20, which can help reduce power consumption.

It is to be noted that, in the present embodiment, the selection circuit SW is controlled according to the connection line selection signal coming from the central processing unit or test device 300. However, this is not limitative of the present technology. Alternatively, upon receipt of an inspection execution instruction from the central processing unit or test device 300, the detection circuit control section 160 may control the section circuit SW to inspect the plurality of connection lines 20 sequentially one at a time.

It is to be noted that, in the present embodiment, where the first circuit C1 and the second circuit C2 are configured to be connected to each other, two circuit vertical wiring parts 25 are provided for each circuit connection pad. However, this is not limitative of the present technology. Alternatively, for example, there may be one, three, or more circuit vertical wiring parts 25 provided for each circuit connection pad. In the case of three or more circuit vertical wiring parts 25 being provided, also, the connection line 20-1 need only increase the number of vertical wiring parts 25 per connection pad in a manner corresponding to the number of the circuit vertical wiring parts 25.

Further, in the present embodiment, the plurality of connection lines 20 share one detection circuit 210. Alternatively, the detection circuit 210 may be provided for each connection line.

<<Variants of First Embodiment>>

Some variants of the first embodiment are described below.

<First Variant>

Figure 8:
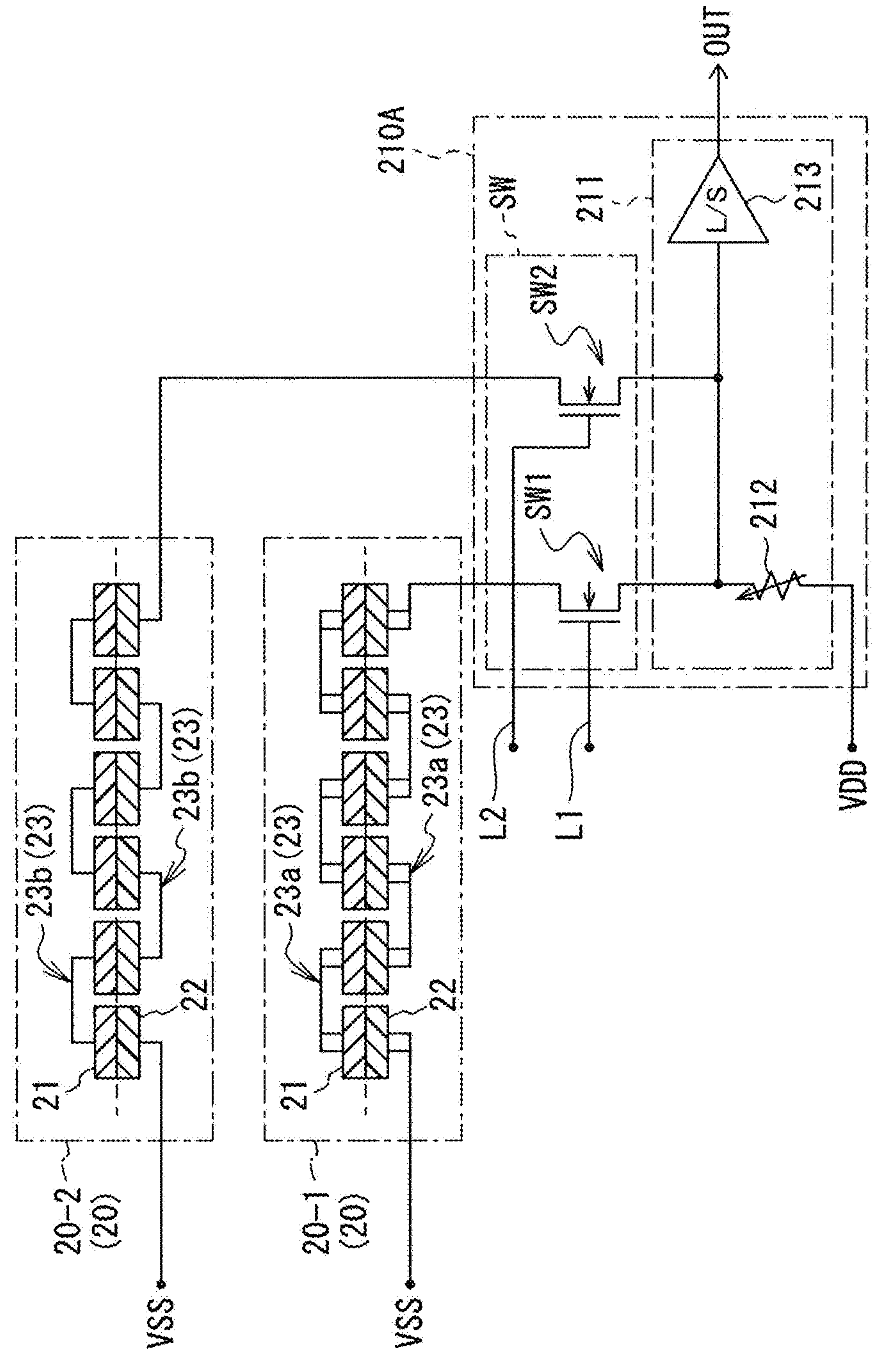
FIG. 8 is an explanatory diagram depicting a connection relation between a detection circuit and connection lines of a light detecting device in a first variant of the first embodiment of the present technology.

The light detecting device 100 in a first variant of the first embodiment has a detection circuit 210A replacing the detection circuit 210, as depicted in FIG. 8. One end of a resistance element 212 possessed by the detection circuit 210A has a first potential that is the power supply potential VDD. Further, one end of the connection line 20 has a second potential that is the reference potential VSS (e.g., ground). That is, the first potential is higher than the second potential in the configuration of the present variant. Further, the switches SW1 and SW2 are constituted by nMOS transistors in the present variant. In the case where "1" as the gate control signal SELSW is input to a gate electrode of the nMOS transistor, the nMOS transistor is turned on to connect the connection line 20 electrically to the resistance element 212 of the failure detecting circuit 211. In the case where "0" as the gate control signal SELSW is input to the gate electrode of the nMOS transistor, the nMOS transistor is turned off to disconnect the connection line 20 electrically from the resistance element 212 of the failure detecting circuit 211.

The light detecting device 100 in the first variant of the first embodiment provides advantageous effects similar to those described above of the light detecting device 100 in the first embodiment.

<Second Variant>

Figure 9:
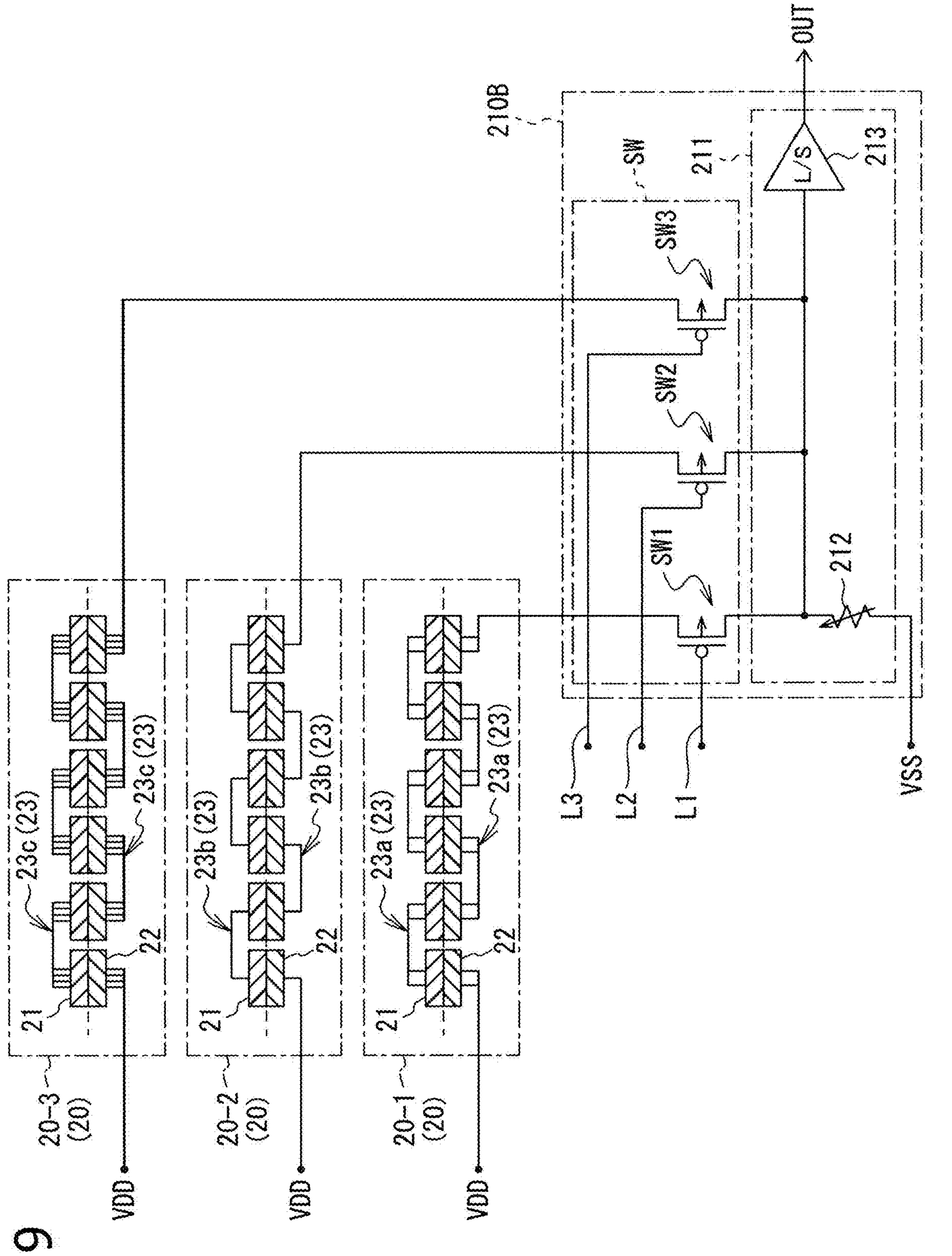
FIG. 9 is an explanatory diagram depicting a connection relation between a detection circuit and connection lines of a light detecting device in a second variant of the first embodiment of the present technology.

The light detecting device 100 in a second variant of the first embodiment has a detection circuit 210B replacing the detection circuit 210, as depicted in FIG. 9. Further, the connection lines 20 are configured by three connection lines, i.e., connection lines 20-1, 20-2, and 20-3. That is, the connection line 20-3 is the third connection line. Further, the detection circuit 210B performs failure inspection using the above three connection lines 20.

The selection circuit SW of the detection circuit 210B has, in addition to the switches SW1 and SW2, a switch SW3 interposed between the connection line 20-3 and the resistance element 212 of the failure detecting circuit 211. The selection circuit SW is thus configured to have the switches whose number corresponds to the number of the connection lines 20.

Figure 10:
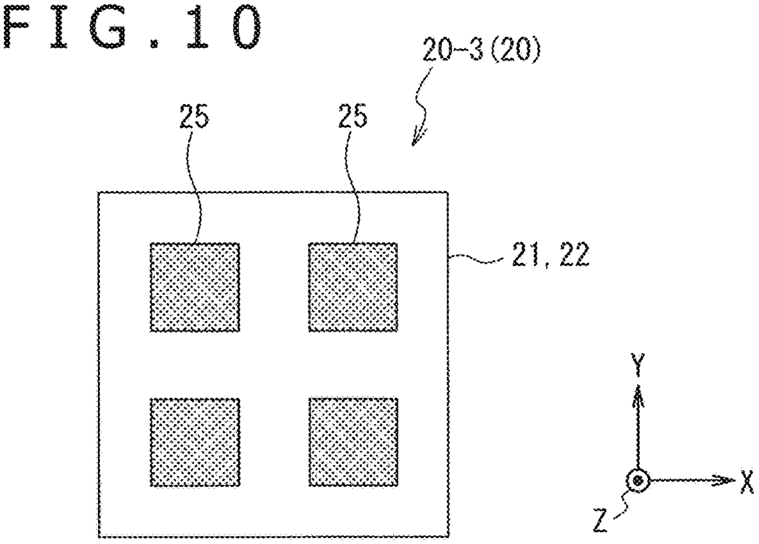
FIG. 10 is a plan view depicting a positional relation between a connection pad and vertical wiring parts on a third connection line in the second variant of the first embodiment of the present technology.

The number of vertical wiring parts 25 possessed by the connection line 20-3 per connection pad is different from the number of vertical wiring parts 25 possessed by the connection line 20-1 or 20-2 per connection pad. In the present variant, the connection line 20-3 has four vertical wiring parts 25 per connection pad. Further, a wiring member 23*c* possessed by the connection line 20-3 has one horizontal wiring part 24 and four vertical wiring parts 25 per connection pad. For the connection line 20-3, a positional relation between the connection pads 21 and 22 on one hand and the vertical wiring parts 25 on the other hand is as depicted in FIG. 10, for example, but is not limited thereto. The cross-section structure of the connection line 20-3 in a longitudinal cross-sectional view is similar to what is depicted in FIG. 4A.

The number of vertical wiring parts 25 possessed by the connection line 20-3 per connection pad is larger than the number of circuit vertical wiring parts 25 provided for each of the circuit connection pads 21 and 22 depicted in FIG. 3A. This configuration makes it possible to inspect the connection line 20-3 for failure, the connection line 20-3 being more robust than a partial configuration of the first circuit C1 and the second circuit C2 being electrically connected to each other.

The light detecting device 100 in the second variant of the first embodiment provides advantageous effects similar to those described above of the light detecting device 100 in the first embodiment.

Further, the light detecting device 100 in the second variant of the first embodiment has three connection lines 20 that are different from each other in robustness and failure detection sensitivity. This makes it possible to evaluate the state of the failure of any connection line 20 from more diverse perspectives.

For example, the connection line 20-3, which is more robust than the partial configuration of the first circuit C1 and the second circuit C2 being electrically connected to each other, can be inspected for failure. This makes it possible to inspect more diverse connection lines 20 for failure. Knowledge can thus be acquired of a configuration which, in the future, may be adopted as the partial configuration of the first circuit C1 and the second circuit C2 being electrically connected to each other.

It is to be noted that, whereas the present variant has three connection lines 20, four or more connection lines 20 may alternatively be provided.

Figure 11A:
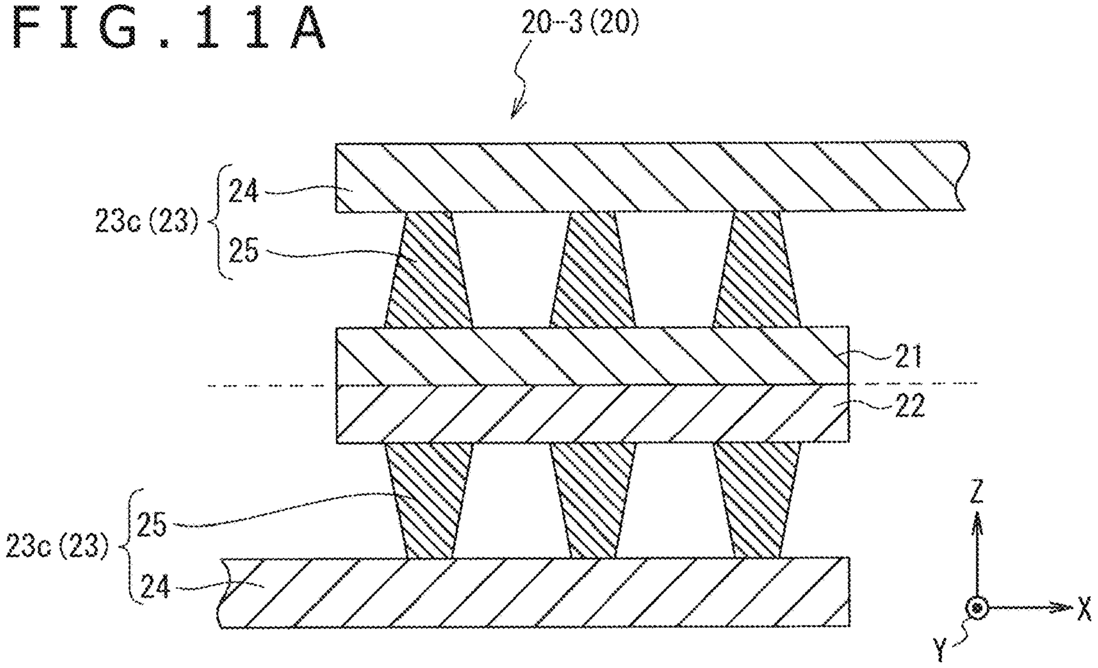
FIG. 11A is a partial longitudinal cross-sectional view of the third connection line configured otherwise.
Figure 11B:
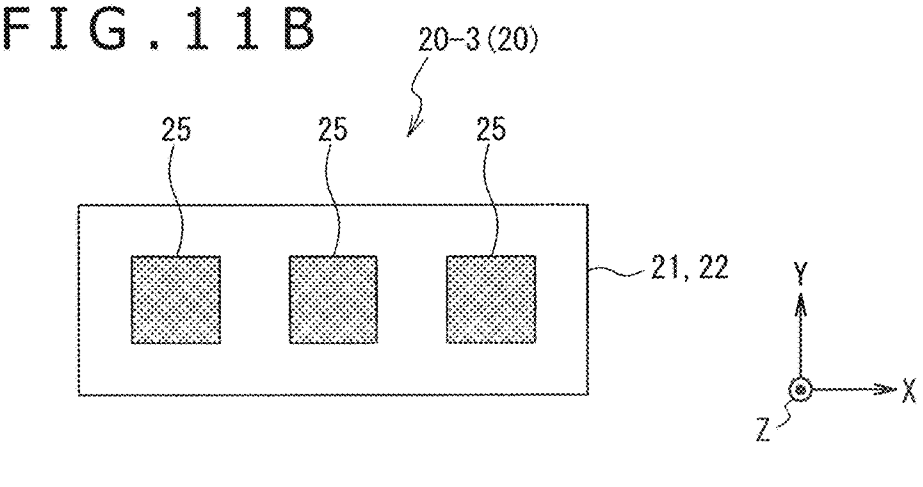
FIG. 11B is a plan view depicting a positional relation between connection pads and vertical wiring parts on the connection line in FIG. 11A.

Further, in the present variant, the connection line 20-3 has four vertical wiring parts 25 per connection pad. Alternatively, the connection line 20-3 may have three, five, or more vertical wiring parts 25 per connection pad as depicted in FIGS. 11A and 11B.

Further, in the present variant, where the first circuit C1 and the second circuit C2 are configured to be electrically connected to each other, two circuit vertical wiring parts 25 are provided for each circuit connection pad. Alternatively, three or more circuit vertical wiring parts 25 may be provided per circuit connection pad. For example, four circuit vertical wiring parts 25 may be provided per circuit connection pad, i.e., as many as in the case of the connection line 20-3. That is, the connection line 20-3 is a connection line 20 having the same configuration as that of the first circuit C1 and the second circuit C2 being electrically connected to each other. This is a configuration where there are provided a plurality of connection lines, more specifically, the connection lines 20-1 and 20-2, that are less robust and more sensitive in failure detection than the connection line 20-3. When a plurality of connection lines 20 are thus provided as the connection lines having lower robustness and higher failure detection sensitivity than the connection line 20-3, it is possible to obtain more findings such as what kind of failure has occurred on the connection line 20, from what part of the connection line 20 the failure has started, and how the failure has progressed over time.

<Third Variant>

Figure 12:
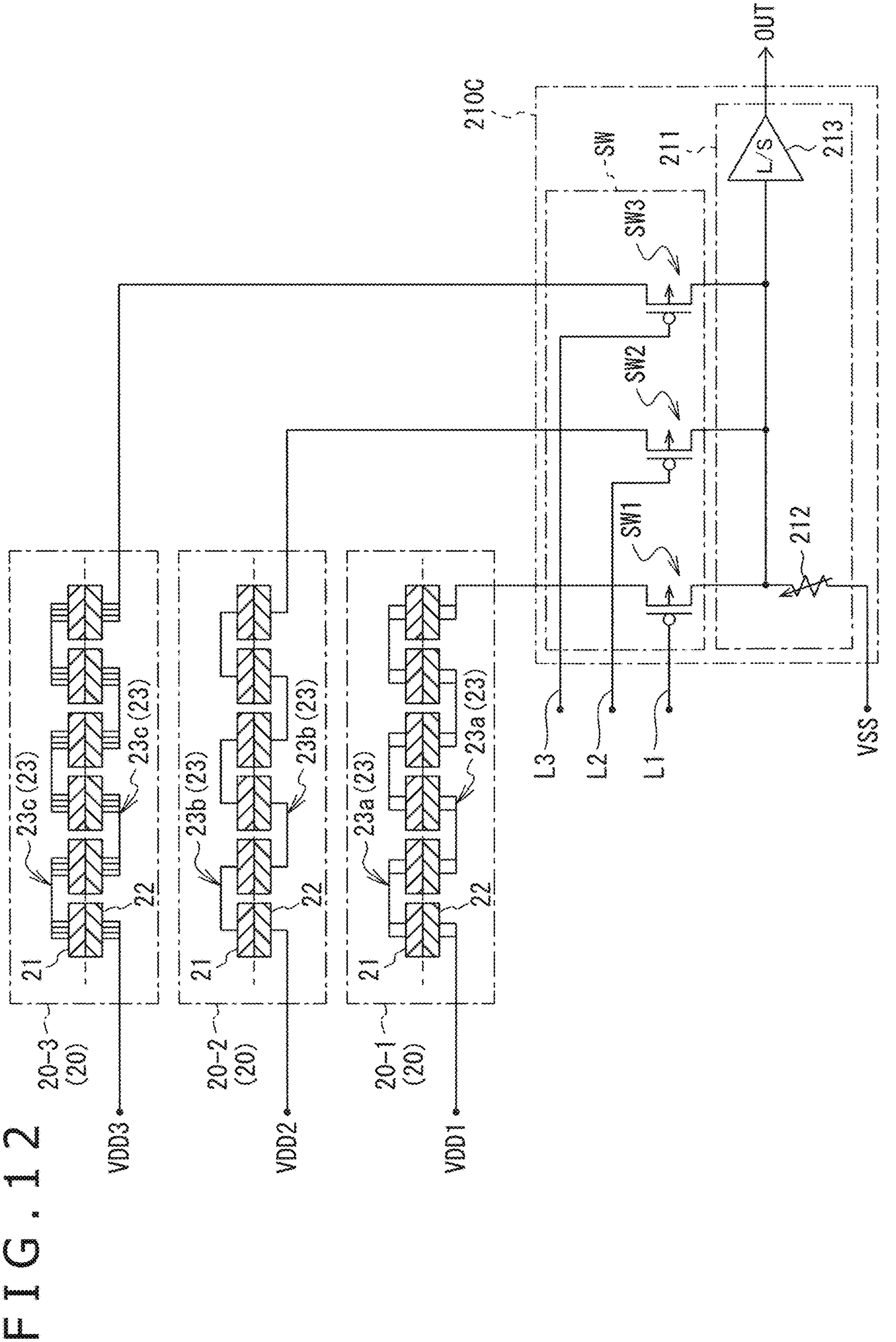
FIG. 12 is an explanatory diagram depicting a connection relation between a detection circuit and connection lines of a light detecting device in a third variant of the first embodiment of the present technology.

The light detecting device 100 in a third variant of the first embodiment has a detection circuit 210C replacing the detection circuit 210, as depicted in FIG. 12. Further, a plurality of connection lines 20 are configured such that the second potential at one end of each of the plurality of connection lines 20 is different.

The second potential of the connection line 20-1 is a power supply potential VDD1; the second potential of the connection line 20-2 is a power supply potential VDD2; and the second potential of the connection line 20-3 is a power supply potential VDD3. Further, the power supply potentials VDD1, VDD2, and VDD3 are different from one another. Further, the detection circuit 210C has withstand voltage transistors corresponding to the power supply potentials VDD1, VDD2, and VDD3 and constituting the switches SW1, SW2, and SW3, respectively.

The light detecting device 100 in the third variant of the first embodiment provides advantageous effects similar to those described above of the light detecting device 100 in the first embodiment.

Second Embodiment

Figure 13:
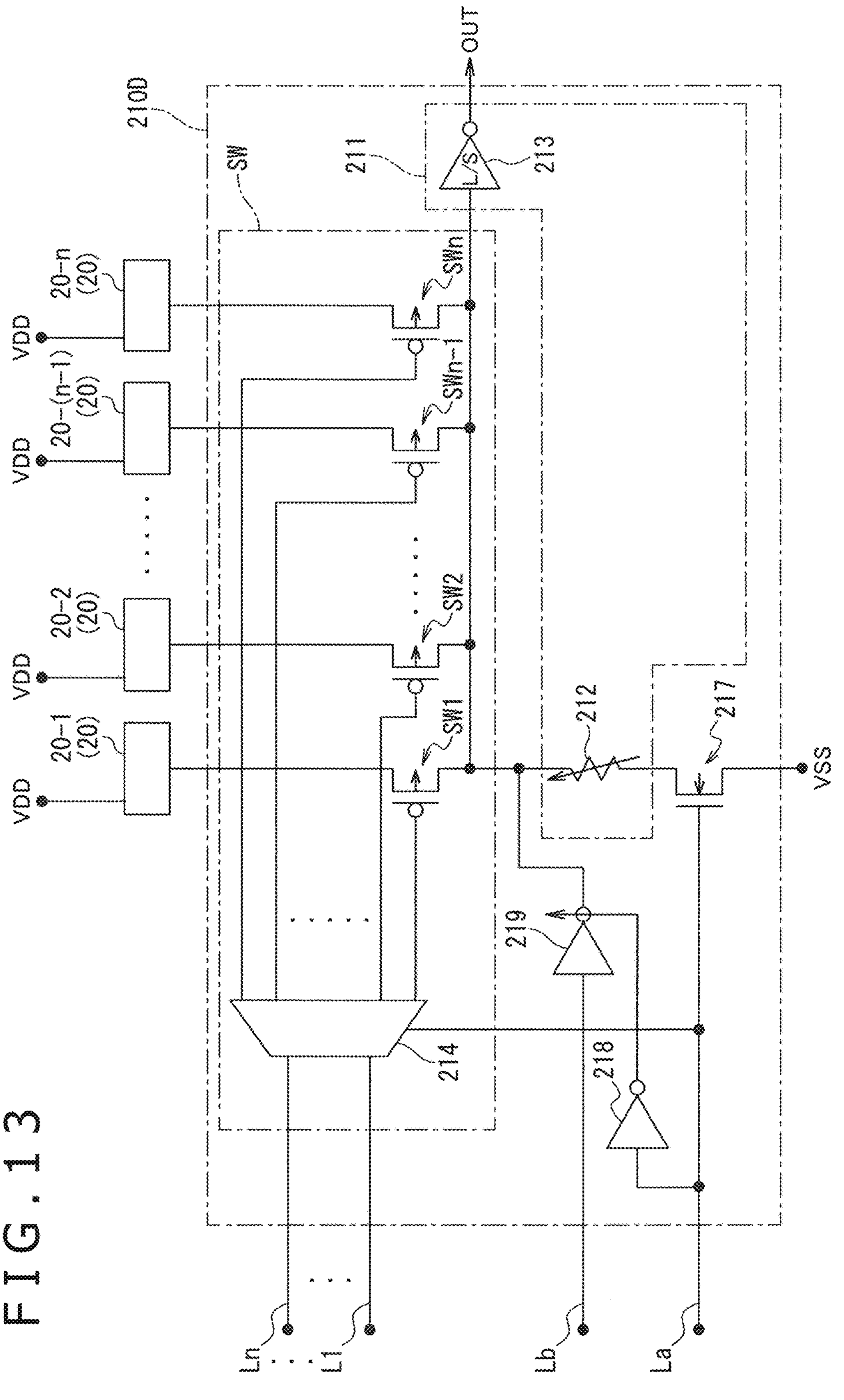
FIG. 13 is an explanatory diagram depicting a connection relation between a detection circuit and connection lines of a light detecting device in a second embodiment of the present technology.
Figure 14:
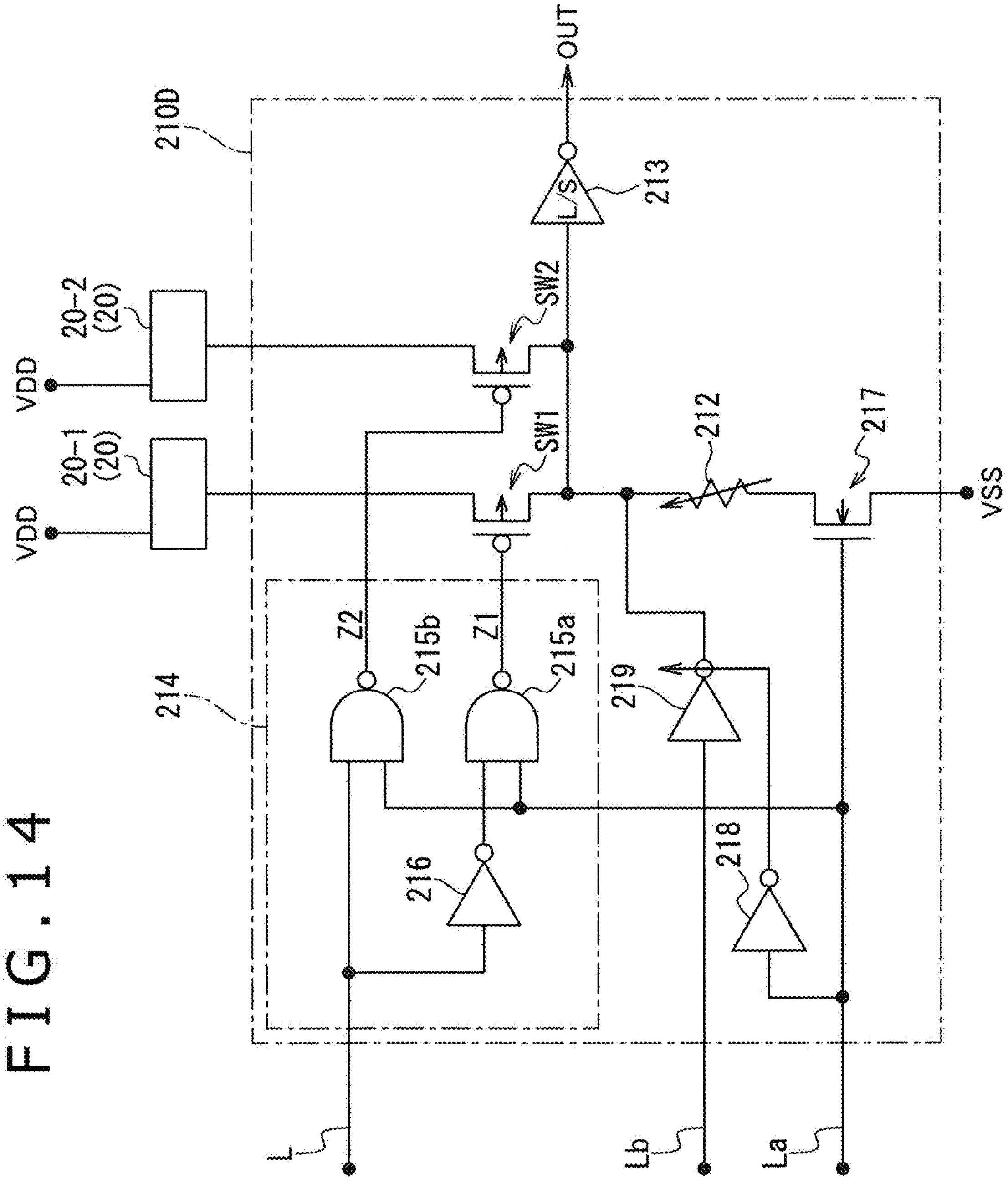
FIG. 14 is an explanatory diagram depicting a specific configuration of a selector in FIG. 13.

A second embodiment of the present technology, which is depicted in FIGS. 13 through 15, is described below. What makes the light detecting device 100 in the second embodiment different from the light detecting device 100 in the above-described first embodiment is that a detection circuit 210D replaces the detection circuit 210. The other structures of the light detecting device 100 in the second embodiment are basically similar to those of the light detecting device 100 in the above first embodiment. The detection circuit 210D is configured to be able to switch between two modes: an enable mode in which the connection lines 20 are inspected for failure, and a disable mode in which the detection circuit 210 itself is inspected for failure. It is to be noted that the constituent elements already discussed above are designated by the same reference signs and will not be described further. Further, in FIG. 13, the connection lines 20 are depicted in a more schematic manner than in the other drawings.

The inspections performed by the central processing unit or test device 300 in FIG. 1 on the light detecting device 100 for various failures include inspection of the detection circuit 210 itself. The central processing unit or test device 300 supplies a mode signal to the common control section 180. The mode signal is a signal that gives instructions to switch the modes of the detection circuit 210D. More specifically, the mode signal gives instructions to switch the detection circuit 210D either to the enable mode or to the disable mode.

The common control section 180 supplies the detection circuit control section 160 with the mode signal coming from the central processing unit or test device 300. Further, on the basis of the mode signal, the detection circuit control section 160 controls the operations of the detection circuit 210 and other components.

As depicted in FIG. 13, the connection lines 20 include a plurality of connection lines 20 ranging from the connection line 20-1 to a connection line 20-$n$. Further, the detection circuit 210D detects whether or not the connection line 20 connected to the failure detecting circuit 211 via the selection circuit SW has failed. The selection circuit SW includes switches ranging from the switch SW1 to a switch SWn. Further, the switches of the selection circuit SW are each constituted by a pMOS transistor. The detection circuit 210D also has the drive lines L1 through Ln to which the gate control signal SELSW is input. The selection circuit SW includes a selector 214. The selector 214 is electrically connected to the drive lines L1 through Ln, to gate electrodes of the switches, and to a drive line La to be discussed later.

Further, in the present embodiment, the determination circuit 213 possessed by the failure detecting circuit 211 is an inverter circuit.
Consequently, in the case where there is no failure on the connection line 20 connected to the failure detecting circuit 211, the determination circuit 213 outputs "L" as the output signal OUT. In the case where the connection line 20 connected to the failure detecting circuit 211 has failed, the determination circuit 213 outputs "H" as the output signal OUT.

The detection circuit 210D has the drive line La to which a control signal DETEN is input and a drive line Lb to which a test signal TESTIN is input. Under control of the detection circuit control section 160, the control signal DETEN and the test signal TESTIN are input to the drive lines La and Lb, respectively. In the case where the mode signal specifies that the detection circuit 210D is to be switched to the enable mode, "1" is input as the control signal DETEN to the drive line La. On the other hand, in the case where the mode signal specifies that the detection circuit 210D is to be switched to the disable mode, "0" is input as the control signal DETEN to the drive line La.

Described below are the operations of the detection circuit 210D in the case where the detection circuit 210D is switched to the enable mode. When switched to the enable mode, the detection circuit 210D is able to inspect whether or not any connection line 20 has failed. When "1" is input as the control signal DETEN to the drive line La, an nMOS transistor 217 of the detection circuit 210D is turned on to connect one end of the resistance element 212 to the reference potential VSS. Here, FIG. 14 illustrates the selector 214 in the case where the connection lines 20 include two connection lines 20-1 and 20-2. FIG. 15 is a truth table of the connection lines 20 in the case where they include two connection lines. For the purpose of simplification, the operations of the detection circuit 210D are explained below taking as an example the case where the connection lines 20 include two connection lines.

Each of the switches in the selector 214 has a NAND circuit. An output Z1 of a NAND circuit 215*a* is input to the gate electrode of the switch SW1, and an output Z2 of a NAND circuit 215*b* is input to the gate electrode of the switch SW2. "1" as the control signal DETEN is input to both the NAND circuit 215*a* and the NAND circuit 215*b*. Further, the gate control signal SELSW is input to the NAND circuit 215*a* via an inverter circuit 216, and the gate control signal SELSW is directly input to the NAND circuit 215*b*. That is, this is a configuration in which the presence or absence of the inverter circuit 216 allows one of the plurality of switches to be selected. "0" or "1" is input as the gate control signal SELSW to the selector 214 via a control line L. Further, as indicated in the truth table in FIG. 15, whether or not any connection line 20 has failed can be detected on the basis of the output signal OUT. It is to be noted that the truth table lists "0s" and "1s" of the control signal DETEN, the test signal TESTIN, and the gate control signal SELSW with respect to "0s" and "1s" of the outputs Z1 and Z2 and expected values "L" and "H" of the output signal OUT.

Described below are the operations of the detection circuit 210D in the case where the detection circuit 210D is switched to the disable mode. When switched to the disable mode, the detection circuit 210D is able to inspect whether or not the detection circuit 210 itself has failed. When "0" is input as the control signal DETEN to the drive line La, the nMOS transistor 217 is turned off to disconnect electrically one end of the resistance element 212 from the reference potential VSS. Further, an inverter circuit 218 possessed by the detection circuit 210D then inverts the control signal DETEN to "1" and supplies the signal "1" to an inverter circuit 219. In turn, the inverter circuit 219 inverts the test signal TESTIN input to the drive line Lb, and supplies the inverted test signal TESTIN to the determination circuit 213. Further, the truth table in FIG. 15 lists the values of the output signal OUT in the case where the detection circuit 210D has not failed. In the case where there is no failure in the detection circuit 210D, the output signal OUT goes "L" in response to the test signal TESTIN being "0," and the output signal OUT goes "H" in response to the test signal TESTIN being "1." On the other hand, in the case where the detection circuit 210D has failed, the output signal OUT goes "H" in response to the test signal TESTIN being "0," and the output signal OUT goes "L" in response to the test signal TESTIN being "1," the signal values not being indicated in the table.

<<Major Advantages of Second Embodiment>>

The light detecting device 100 in the second embodiment provides advantageous effects similar to those described above of the light detecting device 100 in the first embodiment.

<<Variant of Second Embodiment>>

One variant of the second embodiment is described below.

<First Variant>

Figure 16:
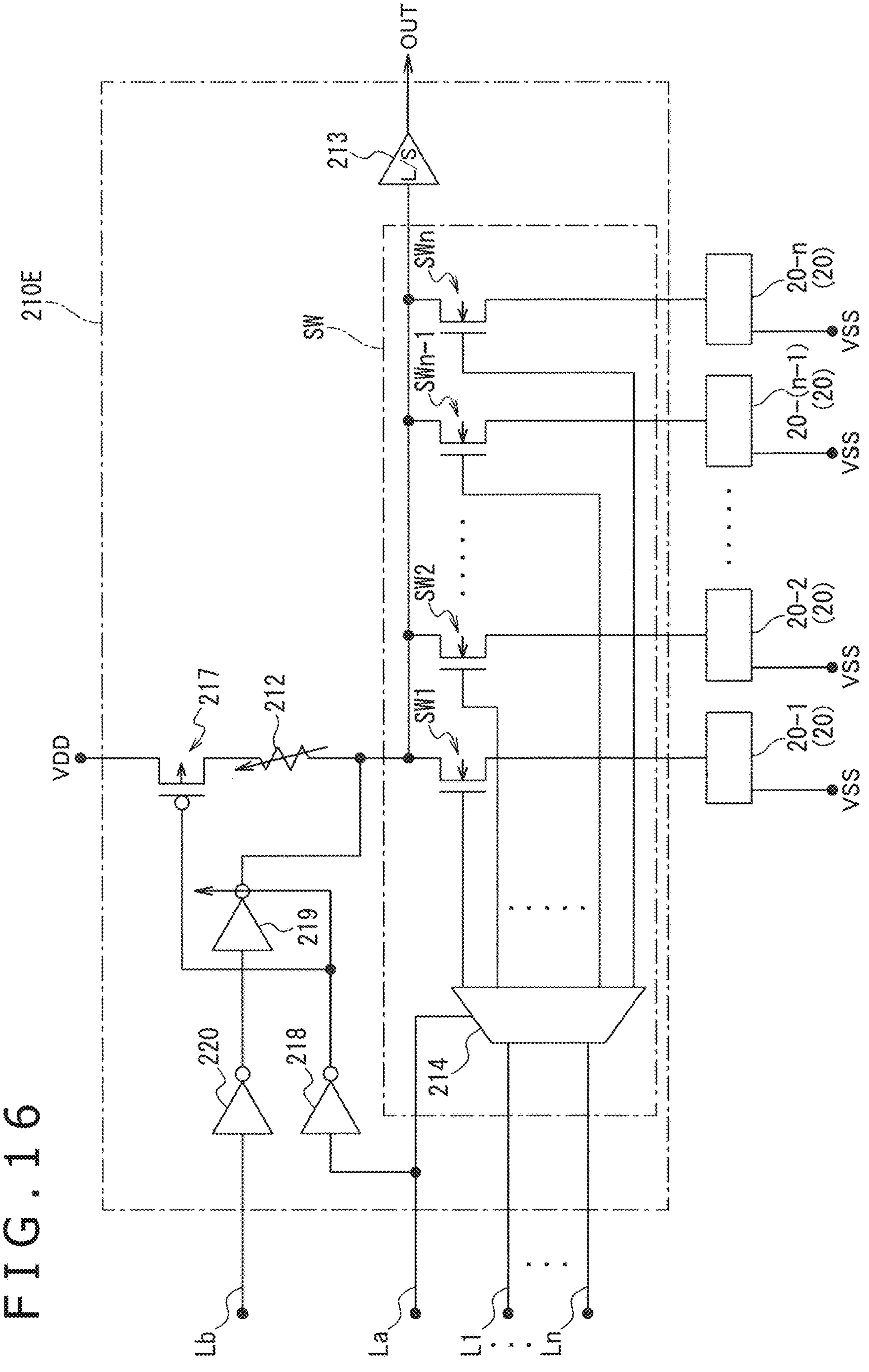
FIG. 16 is an explanatory diagram depicting a connection relation between a detection circuit and connection lines of a light detecting device in a first variant of the second embodiment of the present technology.
Figure 17:
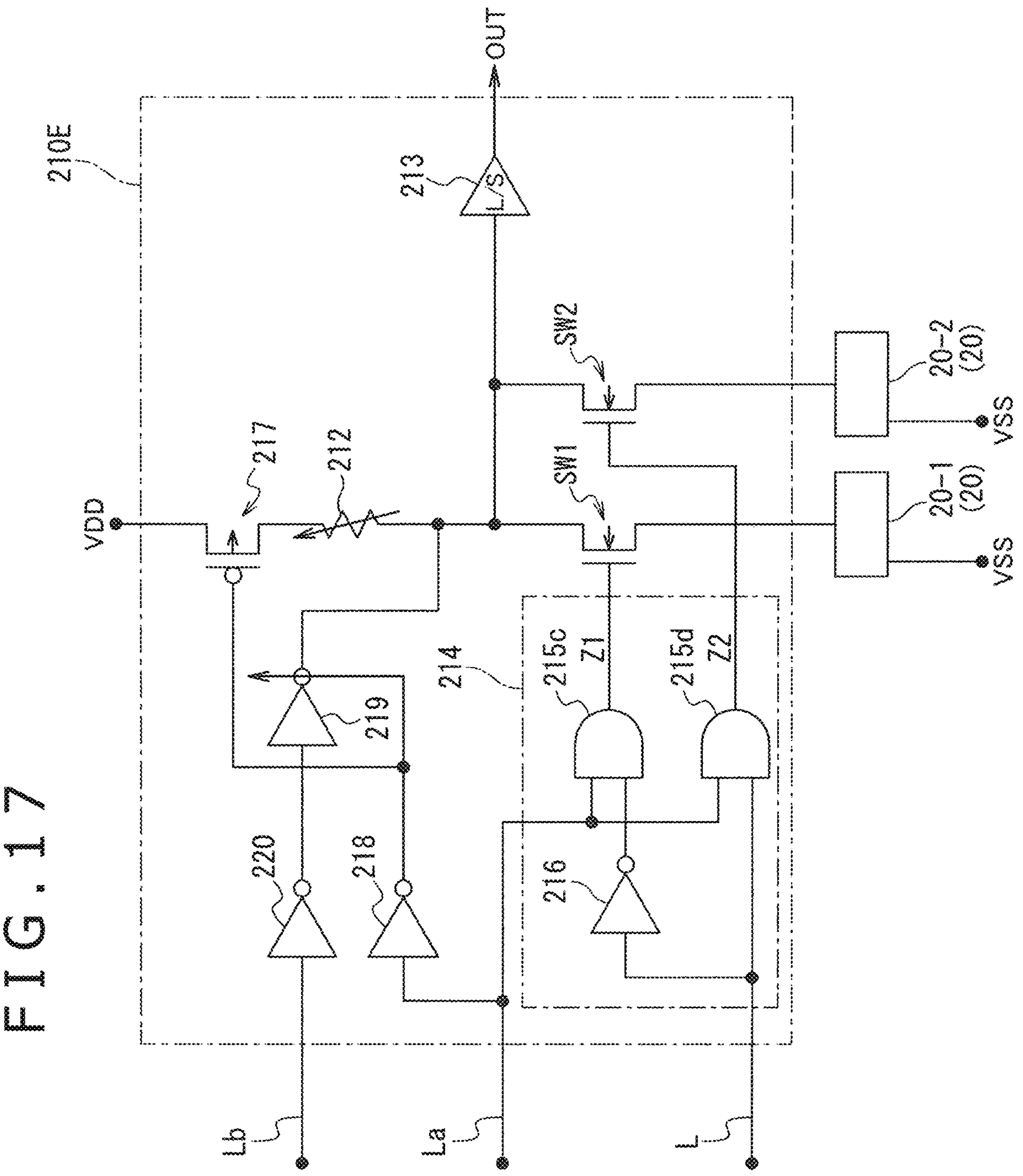
FIG. 17 an explanatory diagram depicting a specific configuration of a selector in FIG. 16.

The light detecting device 100 in a first variant of the second embodiment has a detection circuit 210E replacing the detection circuit 210D as depicted in FIGS. 16 through 18. One end of the resistance element 212 possessed by the detection circuit 210E has a first potential that is the power supply potential VDD. Further, one end of the connection line 20 has a second potential that is the reference potential VSS (e.g., ground). That is, the first potential is higher than the second potential in the configuration of the present variant. Given such differences, the detection circuit 210E in the present variant partially differs in configuration from the detection circuit 210D discussed above in connection with the second embodiment. Explained below is what makes the detection circuit 210E different from the detection circuit 210D.

In the present variant, the switches possessed by the selection circuit SW are each constituted by an nMOS transistor in place of the pMOS transistor. Further, the detection circuit 210E has a pMOS transistor 217 replacing the nMOS transistor 217, and a buffer replacing the inverter circuit as the determination circuit 213. The detection circuit 210E also has an inverter circuit 220. An input side of the inverter circuit 220 is connected to the drive line Lb, and an output side of the inverter circuit 220 is connected to an input side of the inverter circuit 219. The inverter circuit 220 inverts the test signal TESTIN input via the drive line Lb. The test signal TESTIN thus inverted is input to the inverter circuit 219.

Further, comparing the selector 214 of the present variant in FIG. 17 with the selector 214 of the second embodiment in FIG. 14 reveals differences therebetween in configuration, to be discussed below. It is to be noted that FIG. 17 depicts the selector 214 in the case where the connection lines 20 include two connection lines 20-1 and 20-2. In the present variant, the selector 214 has an AND circuit 215*c* in place of the NAND circuit 215*a* and an AND circuit 215*d* replacing the NAND circuit 215*b*. The control signal DETEN is input to both the AND circuit 215*c* and the AND circuit 215*d*.

Further, the gate control signal SELSW is input to the AND circuit 215*c* via the inverter circuit 216, and the gate control signal SELSW is directly input to the AND circuit 215*d*. That is, this is a configuration in which the presence or absence of the inverter circuit 216 allows one of the plurality of switches to be selected. Further, an output Z1 of the AND circuit 215*c* is input to the gate electrode of the switch SW1, and an output Z2 of the AND circuit 215*d* is input to the gate electrode of the switch SW2.

Described below are the operations of the detection circuit 210E in the case where the detection circuit 210E is switched to the enable mode. When "1" is input as the control signal DETEN to the drive line La, the inverter circuit 216 inverts the control signal DETEN. The inverted control signal DETEN, i.e., "0," is input to the gate electrode of the pMOS transistor 217 of the detection circuit 210E, which turns on the pMOS transistor 217. This causes one end of the resistance element 212 to be connected to the power supply potential VDD. Then, "1" is input as the control signal DETEN to both the AND circuit 215*c* and the AND 215*d*. Further, the gate control signal SELSW is input to the AND circuit 215*c* via the inverter circuit 216, and the gate control signal SELSW is directly input to the AND circuit 215*d*. As a result of this, as indicated in the truth table of FIG. 18, whether or not any connection line 20 has failed can be detected on the basis of the output signal OUT.

Described below are the operations of the detection circuit 210E in the case where the detection circuit 210E is switched to the disable mode. When "0" is input as the control signal DETEN to the drive line La, the inverter circuit 216 inverts the control signal DETEN. The inverted control signal DETEN, i.e., "1," is input to the gate electrode of the pMOS transistor 217 in the detection circuit 210E, turning off the pMOS transistor 217. This electrically disconnects one end of the resistance element 212 from the power supply potential VDD. The test signal TESTIN input to the drive line Lb is inverted by the inverter circuit 220 before being supplied to the inverter circuit 219. The other operations of the detection circuit 210E are similar to those of the detection circuit 210D and thus will not be discussed further.

The light detecting device 100 in the first variant of the second embodiment provides advantageous effects similar to those described above of the light detecting device 100 in the first embodiment.

APPLICATION EXAMPLES

<1. Example of Application to Electronic Apparatus>

Figure 19:
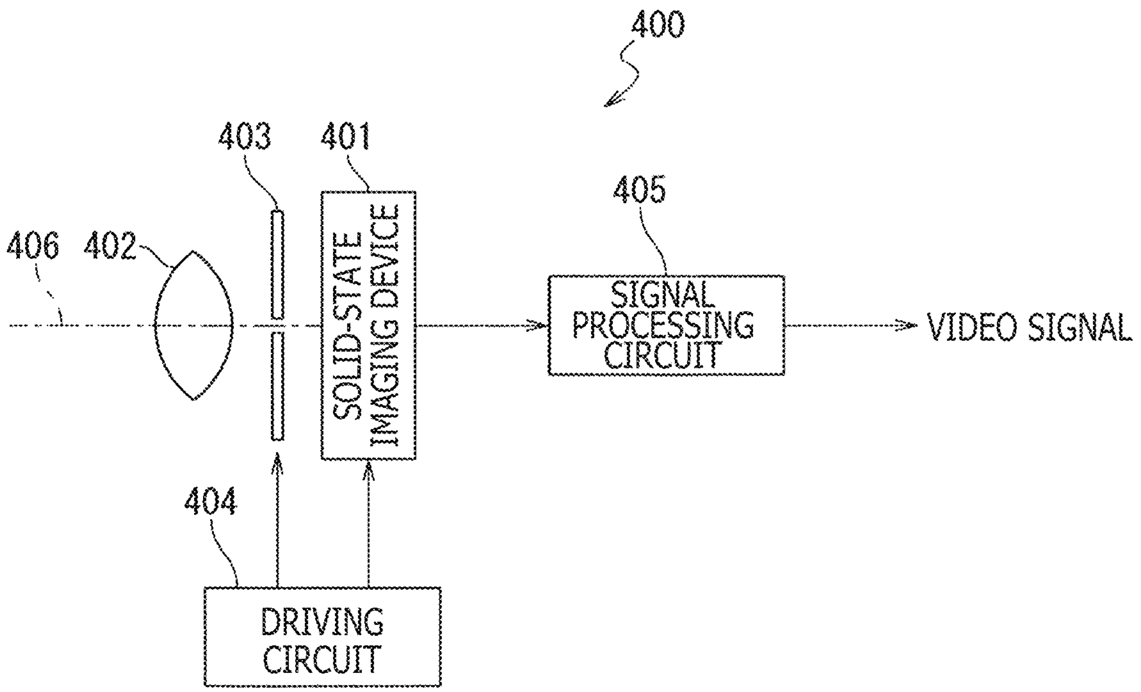
FIG. 19 is a block diagram depicting an exemplary schematic configuration of an electronic apparatus.

An electronic apparatus 400 in FIG. 19 is described below as an example of application of the present technology. The electronic apparatus 400 includes a solid-state imaging device 401, an optical lens 402, a shutter device 403, a driving circuit 404, and a signal processing circuit 405. For example, the electronic apparatus 400 is an electronic apparatus such as a camera but is not limited thereto. Further, the electronic apparatus 400 is equipped with the above-described light detecting device 100 as the solid-state imaging device 401.

The optical lens (optical system) 402 allows image light (incident light 406) from a subject to form an image on an imaging plane of the solid-state imaging device 401. This causes signal charges to be accumulated in the solid-state imaging device 401 over a predetermined period of time. The shutter device 403 controls a light emission period and a light blocking period for the solid-state imaging device 401. The driving circuit 404 supplies drive signals to control a transfer operation of the solid-state imaging device 401 and a shutter operation of the shutter device 403. The drive signal (timing signal) supplied from the driving circuit 404 causes the solid-state imaging device 401 to perform signal transfer. The signal processing circuit 405 performs diverse signal processing on signals (pixel signals) output from the solid-state imaging device 401. A video signal having undergone the signal processing is either stored on a storage medium such as a memory or output to a monitor.

In the above-described configuration, the electronic apparatus 400 can detect whether or not there is any defective joining part between the semiconductor substrates of the solid-state imaging device 401. This can help improve the reliability of the electronic apparatus 400.

It is to be noted that the electronic apparatus 400 is not limited to the camera and may be any of other electronic apparatuses. For example, the electronic apparatus 400 may be an imaging apparatus such as a camera module for use in mobile equipment such as mobile phones.

Further, the electronic apparatus 400 can be furnished with the solid-state imaging device 401 in the form of a light detecting device 100 constituted by any one of the first and second embodiments and their variants, or in the form of a light detecting device 100 combining at least two of the first and second embodiments and their variants.

<2. Example of Application to Mobile Object>

The technology of the present disclosure (present technology) can be applied to diverse products. For example, the technology of the present disclosure may be implemented as a device to be mounted on any type of mobile objects such as automobiles, electric vehicles, hybrid electric vehicles, motorcycles, bicycles, personal mobility devices, aircraft, drones, ships, and robots.

Figure 20:
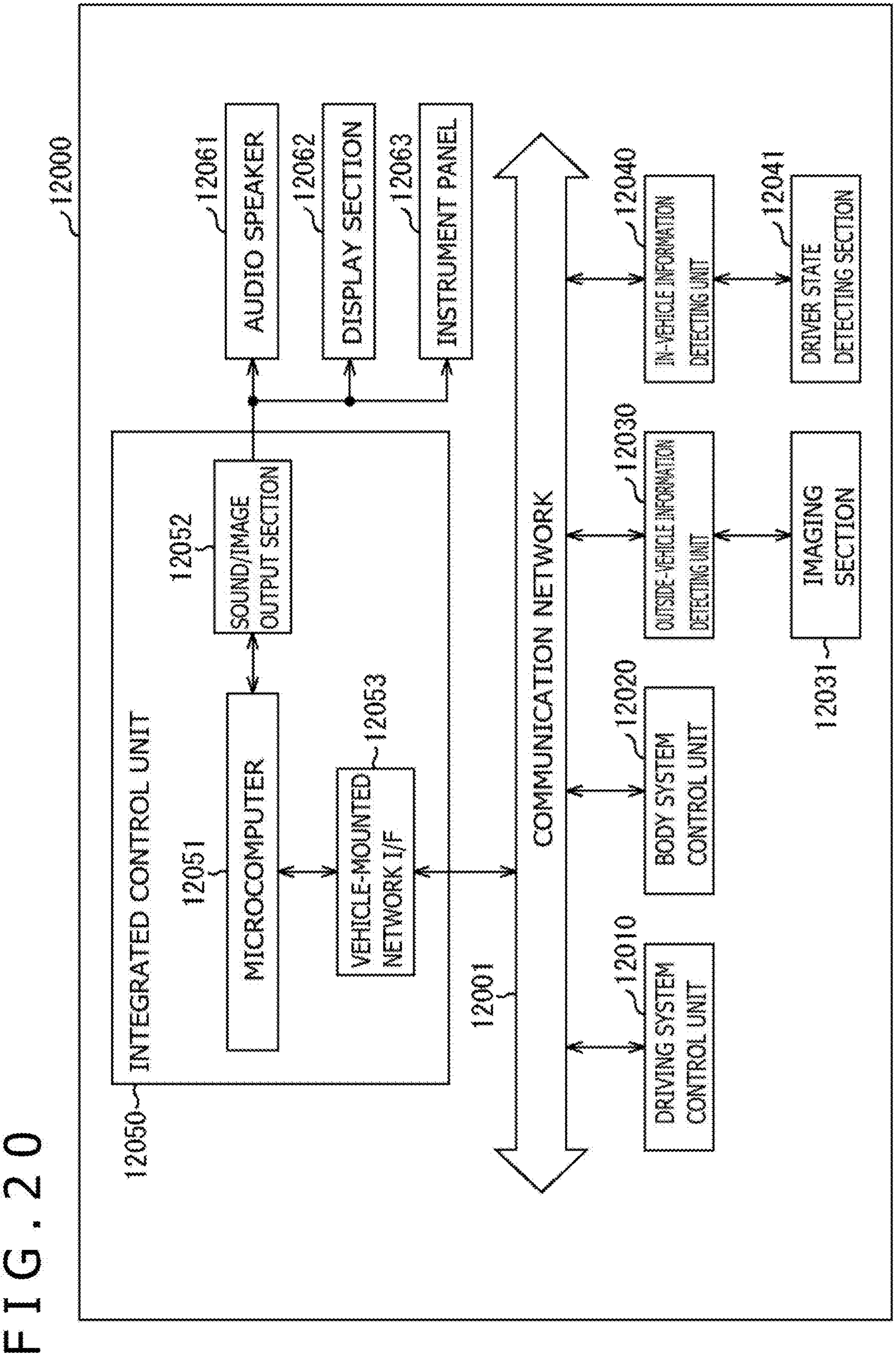
FIG. 20 is a block diagram depicting an example of schematic configuration of a vehicle control system.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

Figure 21:
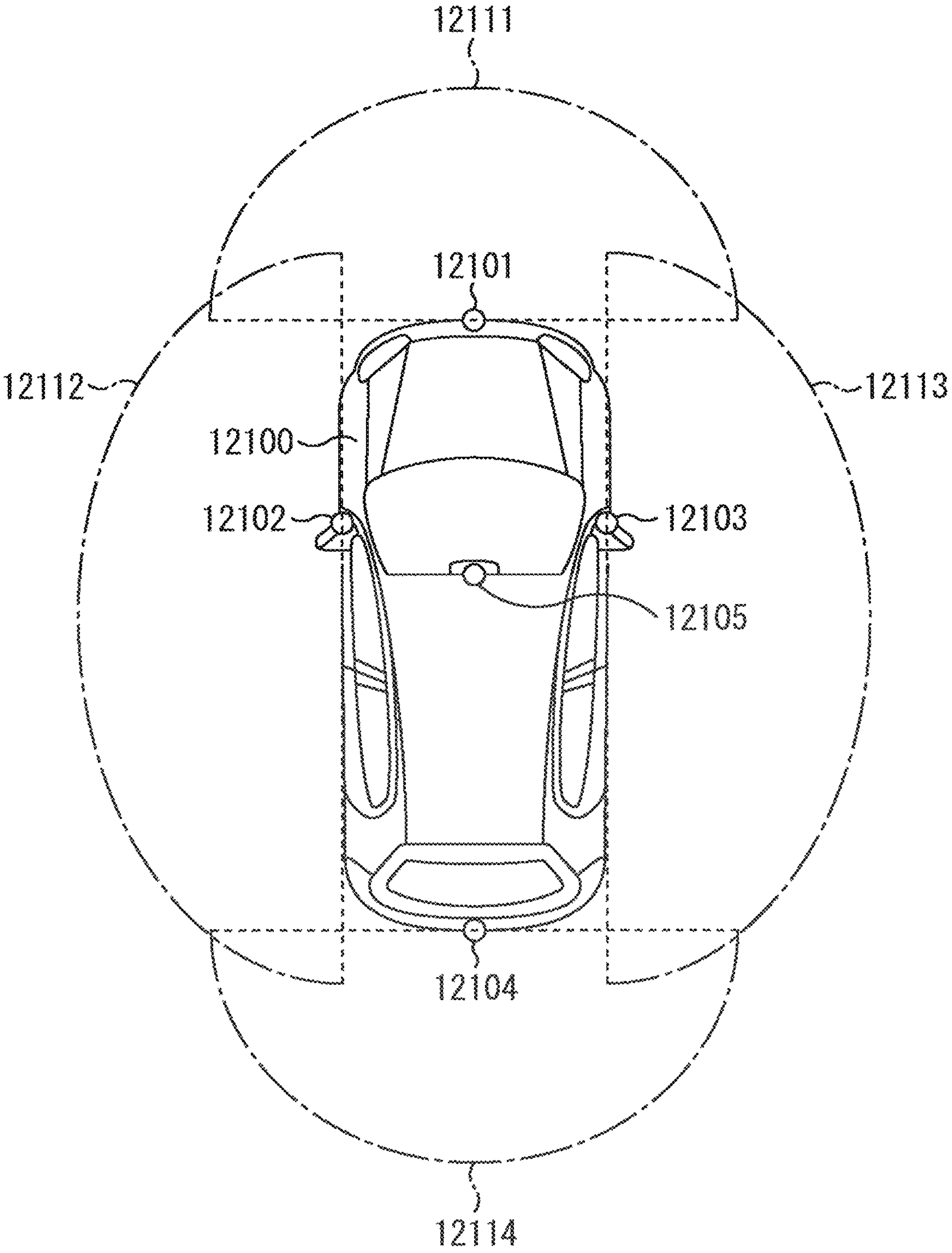
FIG. 21 is a diagram of assistance in explaining an example of installation positions of an outside-vehicle information detecting section and an imaging section.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology of the present disclosure can be applied has been explained above. The technology of the present disclosure can be applied, for example, to the imaging section 12031 from among the components discussed above. Specifically, the above-described light detecting device 100 can be applied to the imaging section 12031. Applying the technology of the present disclosure to the imaging section 12031 makes it possible to detect whether or not there is any defective joining part between the semiconductor substrates of the imaging section 12031, which improves the reliability.

Other Embodiments

Whereas the present technology has been described above in conjunction with the first and second embodiments thereof, the statements and the drawings constituting portions of this disclosure should not be construed as being limitative of the present technology. Various alternative embodiments, alternative working examples, and alternative operation technologies will become apparent to those skilled in the art in light of the present disclosure.

For example, the technical ideas discussed in connection with the first and second embodiments may be combined with one another.

Further, the present technology can be applied to light detecting devices in general, including distance measuring sensors also known as ToF (Time of Flight) sensors, in addition to the above-described solid-state imaging device serving as the image sensor. A distance measuring sensor emits irradiation light at an object, detects reflected light from the surface of the object, and calculates the distance to the object based on the time of flight from emission of the irradiation light until receipt of the reflected light. The structures of the above-described connection lines and detection circuits can be adopted in structuring the distance measuring sensor.

The present technology can also be applied to semiconductor devices other than the light detecting device 100. For example, the technology can be applied to diverse semiconductor devices including memories such as DRAMs, logic circuits, or their combinations.

Further, the materials cited above as constituting the above-described constituent elements may include, for example, additives and impurities.

As described above, the present technology naturally includes various embodiments not described herein. Therefore, the technical scope of the present technology is defined only by the invention-specifying matters according to the scope of claims reasonable from the above description.

Further, the advantageous effects stated in this description are only examples and are not limitative of the present technology. There may be additional advantageous effects derived from and not covered by this description.

It is to be noted that the present technology may also have the following configurations.

(1)

A semiconductor device including:

a first semiconductor substrate;

a second semiconductor substrate stacked on and joined to the first semiconductor substrate;

a connection line having a plurality of pairs of connection pads connected to each other with a joint surface between the first semiconductor substrate and the second semiconductor substrate interposed therebetween, the connection line being routed from one of the first semiconductor substrate and the second semiconductor substrate to the other alternately a plurality of times via the pairs of the connection pads; and a detection circuit configured to be able to detect whether or not the connection line has failed, in which the connection line has a wiring member connecting adjacent ones of the connection pads to each other on each side of the first semiconductor substrate and the second semiconductor substrate, the wiring member has a horizontal wiring part and a vertical wiring part, the horizontal wiring part extending in a horizontal direction, the vertical wiring part extending in a stacking direction and connecting the connection pads to the horizontal wiring part, the connection line has a plurality of connection lines including a first connection line and a second connection line isolated electrically from the first connection line, and the first connection line has M (M is an integer of at least 1) of the vertical wiring parts for each connection pad and the second connection line has N (N is an integer of at least 1) of the vertical wiring parts for each connection pad, M being larger than N.

(2)

The semiconductor device according to (1), in which the detection circuit has a failure detecting circuit and a selection circuit that selectively connects one of the plurality of the connection lines to the failure detecting circuit, the detection circuit being able to detect whether or not the connection line connected to the failure detecting circuit has failed.

(3)

The semiconductor device according to (2), in which the failure detecting circuit has a resistance element and a determination circuit, one end of the resistance element has a first potential, one end of the connection line has a second potential different from the first potential, another end of the connection line is able to be electrically connected to another end of the resistance element via the selection circuit, and the determination circuit is able to detect a third potential as a potential at a position between the connection line connected to the failure detecting circuit on one hand and the resistance element on the other hand, the determination circuit being further able to detect whether or not the connection line connected to the failure detecting circuit has failed, on the basis of the third potential.

(4)

The semiconductor device according to (3), in which the determination circuit includes a level shifter circuit that determines whether or not the third potential is higher than a failure threshold value.

(5)

The semiconductor device according to any of (1) to (4), including:

a first circuit configured on the first semiconductor substrate;

a second circuit configured on the second semiconductor substrate;

a pair of circuit connection pads as the connection pads provided independently of the connection pads possessed by the connection line; and a circuit vertical wiring part provided for each circuit connection pad and extending in the stacking direction, in which, on the first semiconductor substrate, the first circuit and the circuit connection pads are electrically connected to each other by the circuit vertical wiring part, on the second semiconductor substrate, the second circuit and the circuit connection pads are electrically connected to each other by the circuit vertical wiring part, and the number of the vertical wiring parts possessed by the first connection line for each connection pad is the same as the number of the circuit vertical wiring parts provided for each circuit connection pad.

(6)

The semiconductor device according to any of (1) to (5), in which N is 1.

(7)

The semiconductor device according to any of (1) to (6), in which the connection line includes at least three connection lines, the number of the vertical wiring parts provided for each connection pad is different for each of the plurality of the connection lines.

(8)

The semiconductor device according to (3) or (4), in which the second potential at the one end of the connection line is different for each of the plurality of the connection lines.

(9)

The semiconductor device according to any of (1) to (8), in which a semiconductor layer possessed by either of the first semiconductor substrate and the second semiconductor substrate is configured to have a photoelectric conversion element.

(10)

An electronic apparatus including:

a semiconductor device as a light detecting device; and an optical system configured to cause the semiconductor device to form an image of image light from a subject, in which the semiconductor device includes a first semiconductor substrate, a second semiconductor substrate stacked on and joined to the first semiconductor substrate, a connection line having a plurality of pairs of connection pads connected to each other with a joint surface between the first semiconductor substrate and the second semiconductor substrate interposed therebetween, the connection line being routed from one of the first semiconductor substrate and the second semiconductor substrate to the other alternately a plurality of times via the pairs of the connection pads, and a detection circuit configured to be able to detect whether or not the connection line has failed, the connection line has a wiring member connecting adjacent ones of the connection pads to each other on each side of the first semiconductor substrate and the second semiconductor substrate, the wiring member has a horizontal wiring part and a vertical wiring part, the horizontal wiring part extending in a horizontal direction, the vertical wiring part extending in a stacking direction and connecting the connection pads to the horizontal wiring part, the connection line has a plurality of connection lines including a first connection line and a second connection line isolated electrically from the first connection line, and the first connection line has M (M is an integer of at least 1) of the vertical wiring parts for each connection pad and the second connection line has N (N is an integer of at least 1) of the vertical wiring parts for each connection pad, M being larger than N.

The scope of the present technology is not limited to the embodiments illustrated and described above as examples and includes all embodiments that provide advantageous effects equivalent to those intended by the present technology. Furthermore, the scope of the present technology is not limited to the combinations of features of the invention defined by the appended claims and can be determined by all desired combinations of specific ones of the features disclosed herein.

REFERENCE SIGNS LIST

2: Semiconductor chip

3: Pixel

20, 20-1, 20-2, 20-3: Connection line
21, 22: Connection pad
21, 22: Circuit connection pad
21, 22: Test connection pad
23, 23*a*, 23*b*, 23*c*: Wiring member
24: Horizontal wiring part
25: Vertical wiring part
25: Circuit vertical wiring part
25: Test vertical wiring part
100: Light detecting device
101: First semiconductor substrate
102: Second semiconductor substrate
110: Pixel array section
120: Scan control section
130: Control section
140: Signal processing section
150: Output section
160: Detection circuit control section
180: Common control section
199: Joint surface
210, 210A, 210B, 210C, 210D, 210E: Detection circuit
211: Failure detecting circuit
212: Resistance element
213: Determination circuit
214: Selector
300: Test device
C1: First circuit
C2: Second circuit
DETEN: Control signal
OUT: Output signal
SELSW: Gate control signal
SW: Selection circuit
SW1, SW2, SW3: Switch

The invention claimed is:

1. A semiconductor device comprising:

a first semiconductor substrate;

a second semiconductor substrate stacked on and joined to the first semiconductor substrate;

connection lines respectively including pairs of connection pads connected to each other with a joint surface between the first semiconductor substrate and the second semiconductor substrate interposed therebetween, the connection lines being respectively routed between the first semiconductor substrate and the second semiconductor substrate alternately a plurality of times via the pairs of connection pads; and a detection circuit configured to detect whether or not a corresponding connection line has failed, wherein the connection lines respectively include wiring members respectively connecting adjacent ones of the connection pads to each other on each side of the first semiconductor substrate and the second semiconductor substrate, the wiring members respectively include a horizontal wiring part and a vertical wiring part, the horizontal wiring part extending in a horizontal direction, the vertical wiring part extending in a stacking direction and connecting the connection pads to the horizontal wiring part, the connection lines include a first connection line and a second connection line isolated electrically from the first connection line, and the first connection line has M (M is an integer of at least 1) of the vertical wiring parts for each connection pad and the second connection line has N (N is an integer of at least 1) of the vertical wiring parts for each connection pad, M being larger than N.

2. The semiconductor device according to claim 1, wherein the detection circuit includes a failure detecting circuit and a selection circuit that selectively connects one of the connection lines to the failure detecting circuit, the detection circuit being able to detect whether or not the corresponding connection line connected to the failure detecting circuit has failed.

3. The semiconductor device according to claim 2, wherein the failure detecting circuit includes a resistance element and a determination circuit, one end of the resistance element has a first potential, one end of a respective connection line has a second potential different from the first potential, another end of the respective connection line is able to be electrically connected to another end of the resistance element via the selection circuit, and the determination circuit is able to detect a third potential as a potential at a position between the respective connection line connected to the failure detecting circuit as a first detection and the resistance element as a second detection, the determination circuit being further able to detect whether or not the respective connection line connected to the failure detecting circuit has failed, on a basis of the third potential.

4. The semiconductor device according to claim 3, wherein the determination circuit includes a level shifter circuit that determines whether or not the third potential is higher than a failure threshold value.

5. The semiconductor device according to claim 1, comprising:

a first circuit configured on the first semiconductor substrate;

a second circuit configured on the second semiconductor substrate;

a pair of circuit connection pads as the connection pads provided independently of the connection pads possessed by a respective connection line; and a circuit vertical wiring part provided for each circuit connection pad and extending in the stacking direction, wherein, on the first semiconductor substrate, the first circuit and the circuit connection pads are electrically connected to each other by the circuit vertical wiring part, on the second semiconductor substrate, the second circuit and the circuit connection pads are electrically connected to each other by the circuit vertical wiring part, and a number of the vertical wiring parts possessed by the first connection line for each connection pad is same as a number of the circuit vertical wiring parts provided for each circuit connection pad.

6. The semiconductor device according to claim 1, wherein N is 1.

7. The semiconductor device according to claim 1, wherein the connection lines include a third connection line, a number of the vertical wiring parts provided for each connection pad is different for each of the first connection line, the second connection line and the third connection lines.

8. The semiconductor device according to claim 3, wherein the second potential at the one end of the connection lines is different for each of the connection lines.

9. The semiconductor device according to claim 1, wherein a semiconductor layer possessed by either of the first semiconductor substrate and the second semiconductor substrate is configured to have a photoelectric conversion element.

10. An electronic apparatus comprising:

a semiconductor device as a light detecting device; and an optical system configured to cause the semiconductor device to form an image of image light from a subject, wherein the semiconductor device includes a first semiconductor substrate, a second semiconductor substrate stacked on and joined to the first semiconductor substrate, connection lines respectively including pairs of connection pads connected to each other with a joint surface between the first semiconductor substrate and the second semiconductor substrate interposed therebetween, the connection lines being respectively routed between of the first semiconductor substrate and the second semiconductor substrate alternately a plurality of times via the pairs of connection pads; and a detection circuit configured to detect whether or not a corresponding connection line has failed, wherein the connection lines respectively include wiring members respectively connecting adjacent ones of the connection pads to each other on each side of the first semiconductor substrate and the second semiconductor substrate, the wiring members respectively include a horizontal wiring part and a vertical wiring part, the horizontal wiring part extending in a horizontal direction, the vertical wiring part extending in a stacking direction and connecting the connection pads to the horizontal wiring part, the connection lines include a first connection line and a second connection line isolated electrically from the first connection line, and the first connection line has M (M is an integer of at least 1) of the vertical wiring parts for each connection pad and the second connection line has N (N is an integer of at least 1) of the vertical wiring parts for each connection pad, M being larger than N.

11. The electronic apparatus according to claim 10, wherein the detection circuit includes a failure detecting circuit and a selection circuit that selectively connects one of the connection lines to the failure detecting circuit, the detection circuit being able to detect whether or not the corresponding connection line connected to the failure detecting circuit has failed.

12. The electronic apparatus according to claim 11, wherein the failure detecting circuit includes a resistance element and a determination circuit, one end of the resistance element has a first potential, one end of a respective connection line has a second potential different from the first potential, another end of the respective connection line is able to be electrically connected to another end of the resistance element via the selection circuit, and the determination circuit is able to detect a third potential as a potential at a position between the respective connection line connected to the failure detecting circuit as a first detection and the resistance element as a second detection, the determination circuit being further able to detect whether or not the respective connection line connected to the failure detecting circuit has failed, on a basis of the third potential.

13. The electronic apparatus according to claim 12, wherein the determination circuit includes a level shifter circuit that determines whether or not the third potential is higher than a failure threshold value.

14. The electronic apparatus according to claim 10, comprising:

a first circuit configured on the first semiconductor substrate;

a second circuit configured on the second semiconductor substrate;

a pair of circuit connection pads as the connection pads provided independently of the connection pads possessed by a respective connection line; and a circuit vertical wiring part provided for each circuit connection pad and extending in the stacking direction, wherein, on the first semiconductor substrate, the first circuit and the circuit connection pads are electrically connected to each other by the circuit vertical wiring part, on the second semiconductor substrate, the second circuit and the circuit connection pads are electrically connected to each other by the circuit vertical wiring part, and a number of the vertical wiring parts possessed by the first connection line for each connection pad is same as a number of the circuit vertical wiring parts provided for each circuit connection pad.

15. The electronic apparatus according to claim 10, wherein N is 1.

16. The electronic apparatus according to claim 10, wherein the connection lines include a third connection line, a number of the vertical wiring parts provided for each connection pad is different for each of the first connection line, the second connection line and the third connection line.

17. The electronic apparatus according to claim 12, wherein the second potential at the one end of the connection lines is different for each of the connection lines.

18. The electronic apparatus according to claim 10, wherein a semiconductor layer possessed by either of the first semiconductor substrate and the second semiconductor substrate is configured to have a photoelectric conversion element.

* * * * *